(12) United States Patent
Bowler et al.

(10) Patent No.: US 9,025,469 B2
(45) Date of Patent: May 5, 2015

(54) METHOD FOR ESTIMATING CABLE PLANT TOPOLOGY

(71) Applicant: General Instrument Corporation, Horsham, PA (US)

(72) Inventors: David B Bowler, Stow, MA (US); Brian M Basile, Lancaster, MA (US)

(73) Assignee: ARRIS Technology, Inc., Suwanee, GA (US)

( * ) Notice: Subject to any disclaimer, the term of this patent is extended or adjusted under 35 U.S.C. 154(b) by 0 days.

(21) Appl. No.: 13/844,716

(22) Filed: Mar. 15, 2013

(65) Prior Publication Data

US 2014/0278273 A1  Sep. 18, 2014

(51) Int. Cl.
*H04L 12/26* (2006.01)
*H04L 12/24* (2006.01)
*G06F 17/50* (2006.01)

(52) U.S. Cl.
CPC .............. *H04L 41/12* (2013.01); *G06F 17/509* (2013.01); *H04L 41/069* (2013.01); *H04L 41/22* (2013.01)

(58) Field of Classification Search
CPC ....................................................... H04L 41/12
USPC ....................................... 370/242; 455/456.1
See application file for complete search history.

(56) References Cited

U.S. PATENT DOCUMENTS

| | | | |
|---|---|---|---|
| 3,838,221 A | 9/1974 | Schmidt et al. | |
| 4,245,342 A | 1/1981 | Entenman et al. | |
| 4,385,392 A | 5/1983 | Angell et al. | |
| 4,811,360 A | 3/1989 | Potter | |
| 4,999,787 A | 3/1991 | McNally et al. | |
| 5,197,064 A * | 3/1993 | Chao | 370/398 |
| 5,228,060 A | 7/1993 | Uchiyama | |
| 5,251,324 A | 10/1993 | McMullan et al. | |
| 5,271,060 A | 12/1993 | Moran et al. | |

(Continued)

FOREIGN PATENT DOCUMENTS

| | | |
|---|---|---|
| DE | 69631420 T2 | 12/2004 |
| EP | 1235402 A2 | 8/2002 |

(Continued)

OTHER PUBLICATIONS

"Proactive Network Maintenance Using Pre-Equalization," DOCSIS Best Practices and Guidelines, Cable Television Laboratories, Inc., CM-GL-PNMP-V02-110623, Jun. 23, 2011, pp. 133.

(Continued)

*Primary Examiner* — Wei Zhao
(74) *Attorney, Agent, or Firm* — Stewart M. Wiener

(57) ABSTRACT

A method of estimating a topology of a network in which an estimated geographic path of cables of a network between a geographic location of a network component and a geographic location of a terminal network element is automatically generated from data providing the geographic location of the network component and the geographic location of the terminal network element. If the estimated geographic path includes an intersection of separate branches of the path located a predetermined distance from the network component in a downstream direction extending from the network component to the terminal network element, the estimated geographic path is automatically adjusted by replacing the intersection in the estimated geographic path with separate non-intersecting paths extending from different outlet ports of the network component to the separate branches.

17 Claims, 17 Drawing Sheets

(56) References Cited

U.S. PATENT DOCUMENTS

| | | |
|---|---|---|
| 5,278,977 A | 1/1994 | Spencer et al. |
| 5,347,539 A | 9/1994 | Sridhar et al. |
| 5,390,339 A | 2/1995 | Bruckert et al. |
| 5,463,661 A | 10/1995 | Moran et al. |
| 5,532,865 A | 7/1996 | Utsumi et al. |
| 5,557,603 A | 9/1996 | Barlett et al. |
| 5,606,725 A | 2/1997 | Hart |
| 5,631,846 A | 5/1997 | Szurkowski |
| 5,692,010 A | 11/1997 | Nielsen |
| 5,694,437 A | 12/1997 | Yang et al. |
| 5,732,104 A | 3/1998 | Brown et al. |
| 5,757,526 A | 5/1998 | Shiragaki et al. |
| 5,771,274 A | 6/1998 | Harris |
| 5,790,523 A | 8/1998 | Ritchie et al. |
| 5,862,451 A | 1/1999 | Grau et al. |
| 5,867,539 A | 2/1999 | Koslov |
| 5,870,429 A | 2/1999 | Moran et al. |
| 5,886,749 A | 3/1999 | Williams et al. |
| 5,939,887 A | 8/1999 | Schmidt et al. |
| 5,943,604 A | 8/1999 | Chen Wei et al. |
| 6,032,019 A | 2/2000 | Chen Wei et al. |
| 6,061,393 A | 5/2000 | Tsui et al. |
| 6,108,351 A | 8/2000 | Hardy et al. |
| 6,154,503 A | 11/2000 | Strolle et al. |
| 6,229,792 B1 | 5/2001 | Anderson et al. |
| 6,230,326 B1 | 5/2001 | Unger et al. |
| 6,233,274 B1 | 5/2001 | Tsui et al. |
| 6,240,553 B1 | 5/2001 | Son et al. |
| 6,272,150 B1 | 8/2001 | Hrastar et al. |
| 6,278,730 B1 | 8/2001 | Tsui et al. |
| 6,308,286 B1 | 10/2001 | Richmond et al. |
| 6,310,909 B1 | 10/2001 | Jones |
| 6,321,384 B1 | 11/2001 | Eldering |
| 6,330,221 B1 | 12/2001 | Gomez |
| 6,334,219 B1 | 12/2001 | Hill et al. |
| 6,377,552 B1 | 4/2002 | Moran, III et al. |
| 6,385,773 B1 | 5/2002 | Schwartzman et al. |
| 6,389,068 B1 | 5/2002 | Smith et al. |
| 6,434,583 B1 | 8/2002 | Dapper et al. |
| 6,445,734 B1 | 9/2002 | Chen et al. |
| 6,456,597 B1 | 9/2002 | Bare |
| 6,459,703 B1 | 10/2002 | Grimwood et al. |
| 6,477,197 B1 | 11/2002 | Unger |
| 6,477,526 B2 | 11/2002 | Hayashi et al. |
| 6,480,469 B1 | 11/2002 | Moore et al. |
| 6,483,033 B1 | 11/2002 | Simoes et al. |
| 6,498,663 B1 | 12/2002 | Farhan et al. |
| 6,512,616 B1 | 1/2003 | Nishihara |
| 6,526,260 B1 | 2/2003 | Hick et al. |
| 6,546,557 B1 | 4/2003 | Ovadia |
| 6,556,239 B1 | 4/2003 | Al-Araji et al. |
| 6,556,562 B1 | 4/2003 | Bhagavath et al. |
| 6,556,660 B1 | 4/2003 | Li et al. |
| 6,559,756 B2 | 5/2003 | Al-Araji et al. |
| 6,563,868 B1 | 5/2003 | Zhang et al. |
| 6,570,394 B1 | 5/2003 | Williams |
| 6,570,913 B1 | 5/2003 | Chen |
| 6,574,797 B1 | 6/2003 | Naegeli et al. |
| 6,588,016 B1 | 7/2003 | Chen et al. |
| 6,606,351 B1 | 8/2003 | Dapper et al. |
| 6,611,795 B2 | 8/2003 | Cooper |
| 6,646,677 B2 | 11/2003 | Noro et al. |
| 6,662,135 B1 | 12/2003 | Burns et al. |
| 6,662,368 B1 | 12/2003 | Cloonan et al. |
| 6,671,334 B1 | 12/2003 | Kuntz et al. |
| 6,687,632 B1 | 2/2004 | Rittman |
| 6,690,655 B1 | 2/2004 | Miner et al. |
| 6,700,875 B1 | 3/2004 | Schroeder et al. |
| 6,700,927 B1 | 3/2004 | Esliger et al. |
| 6,711,134 B1 | 3/2004 | Wichelman et al. |
| 6,741,947 B1 | 5/2004 | Wichelman et al. |
| 6,748,551 B2 | 6/2004 | Furudate et al. |
| 6,757,253 B1 | 6/2004 | Cooper et al. |
| 6,772,388 B2 | 8/2004 | Cooper et al. |
| 6,772,437 B1 | 8/2004 | Cooper et al. |
| 6,775,840 B1 | 8/2004 | Naegel et al. |
| 6,785,473 B1 | 8/2004 | Sasaki et al. |
| 6,816,463 B2 | 11/2004 | Cooper et al. |
| 6,834,057 B1 | 12/2004 | Rabenko et al. |
| 6,839,829 B1 | 1/2005 | Daruwalla et al. |
| 6,853,932 B1 | 2/2005 | Wichelman et al. |
| 6,877,166 B1 | 4/2005 | Roeck et al. |
| 6,895,043 B1 | 5/2005 | Naegeli et al. |
| 6,895,594 B1 | 5/2005 | Simoes et al. |
| 6,906,526 B2 | 6/2005 | Hart, Jr. et al. |
| 6,928,475 B2 | 8/2005 | Schenkel et al. |
| 6,944,881 B1 | 9/2005 | Vogel |
| 6,961,314 B1 | 11/2005 | Quigley et al. |
| 6,961,370 B2 | 11/2005 | Chappell |
| 6,967,994 B2 | 11/2005 | Boer et al. |
| 6,973,141 B1 | 12/2005 | Isaksen et al. |
| 6,985,437 B1 | 1/2006 | Vogel |
| 6,987,754 B2 | 1/2006 | Shahar et al. |
| 6,999,408 B1 | 2/2006 | Gomez |
| 7,002,899 B2 | 2/2006 | Azenkot et al. |
| 7,010,002 B2 | 3/2006 | Chow et al. |
| 7,017,176 B1 | 3/2006 | Lee et al. |
| 7,032,159 B2 | 4/2006 | Lusky et al. |
| 7,039,939 B1 | 5/2006 | Millet et al. |
| 7,050,419 B2 | 5/2006 | Azenkot et al. |
| 7,054,554 B1 | 5/2006 | McNamara et al. |
| 7,058,007 B1 | 6/2006 | Daruwalla et al. |
| 7,072,365 B1 | 7/2006 | Ansley |
| 7,079,457 B2 | 7/2006 | Wakabayashi et al. |
| 7,099,412 B2 | 8/2006 | Coffey |
| 7,099,580 B1 | 8/2006 | Bulbul |
| 7,139,283 B2 | 11/2006 | Quigley et al. |
| 7,142,609 B2 | 11/2006 | Terreault et al. |
| 7,145,887 B1 | 12/2006 | Akgun et al. |
| 7,152,025 B2 | 12/2006 | Lusky et al. |
| 7,158,542 B1 | 1/2007 | Zeng et al. |
| 7,164,694 B1 | 1/2007 | Nodoushani et al. |
| 7,177,324 B1 | 2/2007 | Choudhury et al. |
| 7,197,067 B2 | 3/2007 | Lusky et al. |
| 7,222,255 B1 | 5/2007 | Claessens et al. |
| 7,227,863 B1 | 6/2007 | Leung et al. |
| 7,242,862 B2 | 7/2007 | Saunders et al. |
| 7,246,368 B1 | 7/2007 | Millet et al. |
| 7,263,123 B2 | 8/2007 | Yousef |
| 7,274,735 B2 | 9/2007 | Lusky et al. |
| 7,286,756 B1 | 10/2007 | Marshall et al. |
| 7,295,518 B1 | 11/2007 | Monk et al. |
| 7,315,573 B2 | 1/2008 | Lusky et al. |
| 7,315,967 B2 | 1/2008 | Azenko et al. |
| 7,400,677 B2 | 7/2008 | Jones |
| 7,421,276 B2 | 9/2008 | Steer et al. |
| 7,451,472 B2 | 11/2008 | Williams |
| 7,492,703 B2 | 2/2009 | Lusky et al. |
| 7,554,902 B2 | 6/2009 | Kim et al. |
| 7,573,884 B2 | 8/2009 | Klimker et al. |
| 7,573,935 B2 | 8/2009 | Min et al. |
| 7,584,298 B2 | 9/2009 | Klinker et al. |
| 7,616,654 B2 | 11/2009 | Moran, III et al. |
| 7,650,112 B2 | 1/2010 | Utsumi et al. |
| 7,672,310 B2 | 3/2010 | Cooper et al. |
| 7,684,315 B1 | 3/2010 | Beser |
| 7,684,341 B2 | 3/2010 | Howald |
| 7,693,042 B1 | 4/2010 | Wei |
| 7,693,090 B1 | 4/2010 | Kimpe |
| 7,701,938 B1 | 4/2010 | Bernstein et al. |
| 7,716,712 B2 | 5/2010 | Booth et al. |
| 7,739,359 B1 | 6/2010 | Millet et al. |
| 7,742,697 B2 | 6/2010 | Cooper et al. |
| 7,742,771 B2 | 6/2010 | Thibeault |
| 7,760,624 B1 | 7/2010 | Goodson et al. |
| 7,764,231 B1 | 7/2010 | Karr et al. |
| 7,778,314 B2 | 8/2010 | Wajcer et al. |
| 7,787,557 B2 | 8/2010 | Kim et al. |
| 7,792,183 B2 | 9/2010 | Massey et al. |
| 7,826,569 B2 | 11/2010 | Popper et al. |
| 7,856,049 B2 | 12/2010 | Currivan et al. |
| 7,876,697 B2 | 1/2011 | Thompson et al. |
| 7,953,144 B2 | 5/2011 | Allen et al. |
| 7,958,534 B1 | 6/2011 | Beser |

(56) References Cited

U.S. PATENT DOCUMENTS

| | | |
|---|---|---|
| 7,970,010 B2 | 6/2011 | Denney et al. |
| 7,983,162 B1 | 7/2011 | Ford et al. |
| 8,000,254 B2 | 8/2011 | Thompson et al. |
| 8,037,541 B2 | 10/2011 | Montague et al. |
| 8,040,915 B2 | 10/2011 | Cummings |
| 8,059,546 B2 | 11/2011 | Pai et al. |
| 8,081,674 B2 | 12/2011 | Thompson et al. |
| 8,116,360 B2 | 2/2012 | Thibeault |
| 8,265,559 B2 | 9/2012 | Cooper et al. |
| 8,279,764 B2 | 10/2012 | Cooper et al. |
| 8,284,828 B2 | 10/2012 | Cooper et al. |
| 8,345,557 B2 | 1/2013 | Thibeault et al. |
| 8,526,485 B2 | 9/2013 | Thompson et al. |
| 8,537,972 B2 | 9/2013 | Thompson et al. |
| 8,594,118 B2 | 11/2013 | Cooper et al. |
| 2001/0055319 A1 | 12/2001 | Quigley et al. |
| 2002/0038461 A1 | 3/2002 | White |
| 2002/0044531 A1 | 4/2002 | Cooper et al. |
| 2002/0091970 A1 | 7/2002 | Furudate et al. |
| 2002/0116493 A1 | 8/2002 | Schenkel et al. |
| 2002/0119783 A1 | 8/2002 | Bourlas et al. |
| 2002/0154620 A1 | 10/2002 | Azenkot et al. |
| 2002/0168131 A1 | 11/2002 | Walter et al. |
| 2002/0181395 A1 | 12/2002 | Foster et al. |
| 2003/0028898 A1 | 2/2003 | Howald |
| 2003/0043732 A1 | 3/2003 | Walton et al. |
| 2003/0067883 A1 | 4/2003 | Azenkot et al. |
| 2003/0067944 A1 | 4/2003 | Sala et al. |
| 2003/0101463 A1 | 5/2003 | Greene et al. |
| 2003/0108052 A1 | 6/2003 | Inoue et al. |
| 2003/0120819 A1 | 6/2003 | Abramson |
| 2003/0138250 A1 | 7/2003 | Glynn |
| 2003/0149991 A1 | 8/2003 | Reidhead et al. |
| 2003/0158940 A1 | 8/2003 | Leigh |
| 2003/0179768 A1 | 9/2003 | Lusky et al. |
| 2003/0179770 A1 | 9/2003 | Reznic et al. |
| 2003/0179821 A1 | 9/2003 | Lusky et al. |
| 2003/0181185 A1 | 9/2003 | Lusky et al. |
| 2003/0182664 A1 | 9/2003 | Lusky et al. |
| 2003/0185176 A1 | 10/2003 | Lusky et al. |
| 2003/0188254 A1 | 10/2003 | Lusky et al. |
| 2003/0200317 A1 | 10/2003 | Zeitak et al. |
| 2003/0212999 A1 | 11/2003 | Cai |
| 2004/0015765 A1 | 1/2004 | Cooper et al. |
| 2004/0042385 A1 | 3/2004 | Kim et al. |
| 2004/0047284 A1 | 3/2004 | Eidson |
| 2004/0052248 A1 | 3/2004 | Frank et al. |
| 2004/0052356 A1 | 3/2004 | McKinzie et al. |
| 2004/0062548 A1 | 4/2004 | Obeda et al. |
| 2004/0073937 A1 | 4/2004 | Williams |
| 2004/0096216 A1 | 5/2004 | Ito |
| 2004/0109661 A1 | 6/2004 | Bierman et al. |
| 2004/0139473 A1 | 7/2004 | Greene |
| 2004/0163129 A1 | 8/2004 | Chapman et al. |
| 2004/0181811 A1 | 9/2004 | Rakib |
| 2004/0208513 A1 | 10/2004 | Peddanarappagari et al. |
| 2004/0233234 A1 | 11/2004 | Chaudhry et al. |
| 2004/0233926 A1 | 11/2004 | Cummings |
| 2004/0248520 A1 | 12/2004 | Miyoshi |
| 2004/0261119 A1 | 12/2004 | Williams |
| 2005/0010958 A1 | 1/2005 | Rakib et al. |
| 2005/0025145 A1 | 2/2005 | Rakib et al. |
| 2005/0034159 A1 | 2/2005 | Ophir et al. |
| 2005/0039103 A1 | 2/2005 | Azenko et al. |
| 2005/0058082 A1 | 3/2005 | Moran et al. |
| 2005/0064890 A1 | 3/2005 | Johan et al. |
| 2005/0097617 A1 | 5/2005 | Currivan et al. |
| 2005/0099951 A1 | 5/2005 | Mohan et al. |
| 2005/0108763 A1 | 5/2005 | Baran et al. |
| 2005/0122996 A1 | 6/2005 | Azenkot et al. |
| 2005/0163088 A1 | 7/2005 | Yamano et al. |
| 2005/0175080 A1 | 8/2005 | Bouillett |
| 2005/0183130 A1 | 8/2005 | Sadja et al. |
| 2005/0198688 A1 | 9/2005 | Fong |
| 2005/0226161 A1 | 10/2005 | Jaworski |
| 2005/0281200 A1 | 12/2005 | Terreault |
| 2006/0013147 A1 | 1/2006 | Terpstra |
| 2006/0088056 A1 | 4/2006 | Quigley et al. |
| 2006/0121946 A1 | 6/2006 | Walton et al. |
| 2006/0250967 A1 | 11/2006 | Miller et al. |
| 2006/0262722 A1 | 11/2006 | Chapman et al. |
| 2006/0291503 A1 | 12/2006 | Chapman |
| 2007/0002752 A1 | 1/2007 | Thibeault et al. |
| 2007/0030805 A1 | 2/2007 | Pantelias et al. |
| 2007/0058542 A1 | 3/2007 | Thibeault |
| 2007/0076592 A1 | 4/2007 | Thibeault |
| 2007/0076789 A1 | 4/2007 | Thibeault |
| 2007/0076790 A1 | 4/2007 | Thibeault et al. |
| 2007/0086328 A1 | 4/2007 | Kao et al. |
| 2007/0094691 A1 | 4/2007 | Gazdzinski |
| 2007/0097907 A1 | 5/2007 | Cummings |
| 2007/0121712 A1 | 5/2007 | Okamoto |
| 2007/0133672 A1 | 6/2007 | Lee et al. |
| 2007/0143654 A1 | 6/2007 | Joyce et al. |
| 2007/0147489 A1 | 6/2007 | Sun |
| 2007/0177526 A1 | 8/2007 | Siripunkaw et al. |
| 2007/0184835 A1 | 8/2007 | Bitran et al. |
| 2007/0189770 A1 | 8/2007 | Sucharczuk et al. |
| 2007/0201547 A1 | 8/2007 | Willcocks et al. |
| 2007/0206600 A1 | 9/2007 | Klimker et al. |
| 2007/0206625 A1 | 9/2007 | Maeda |
| 2007/0211618 A1 | 9/2007 | Cooper et al. |
| 2007/0223512 A1 | 9/2007 | Cooper et al. |
| 2007/0223513 A1 | 9/2007 | Pantelias et al. |
| 2007/0223920 A1 | 9/2007 | Moore et al. |
| 2007/0245177 A1 | 10/2007 | Cooper et al. |
| 2008/0056713 A1 | 3/2008 | Cooper et al. |
| 2008/0062888 A1 | 3/2008 | Lusky et al. |
| 2008/0065960 A1 | 3/2008 | Cheng et al. |
| 2008/0069006 A1 | 3/2008 | Walter et al. |
| 2008/0075157 A1 | 3/2008 | Allen et al. |
| 2008/0101210 A1 | 5/2008 | Thompson et al. |
| 2008/0125984 A1 | 5/2008 | Skendzic et al. |
| 2008/0140823 A1 | 6/2008 | Thompson et al. |
| 2008/0193137 A1 | 8/2008 | Thompson et al. |
| 2008/0200129 A1 | 8/2008 | Cooper et al. |
| 2008/0242339 A1 | 10/2008 | Anderson |
| 2008/0250508 A1 | 10/2008 | Montague et al. |
| 2008/0274700 A1 | 11/2008 | Li |
| 2008/0291840 A1 | 11/2008 | Cooper et al. |
| 2009/0031384 A1 | 1/2009 | Brooks et al. |
| 2009/0103557 A1 | 4/2009 | Hong et al. |
| 2009/0103669 A1 | 4/2009 | Kolze et al. |
| 2009/0109877 A1 | 4/2009 | Murray et al. |
| 2009/0158096 A1 | 6/2009 | Ali et al. |
| 2009/0249421 A1 | 10/2009 | Liu et al. |
| 2009/0252234 A1 | 10/2009 | Samdani et al. |
| 2010/0083356 A1 | 4/2010 | Steckley et al. |
| 2010/0095360 A1 | 4/2010 | Pavlovski et al. |
| 2010/0128739 A1 | 5/2010 | Jung et al. |
| 2010/0154016 A1 | 6/2010 | Li et al. |
| 2010/0154017 A1 | 6/2010 | An et al. |
| 2010/0157824 A1 | 6/2010 | Thompson et al. |
| 2010/0158093 A1 | 6/2010 | Thompson et al. |
| 2010/0185391 A1 | 7/2010 | Lee et al. |
| 2010/0223650 A1 | 9/2010 | Millet et al. |
| 2010/0251320 A1 | 9/2010 | Shafer et al. |
| 2010/0322390 A1* | 12/2010 | Bialk et al. .................. 379/32.04 |
| 2011/0026577 A1 | 2/2011 | Primo et al. |
| 2011/0030019 A1 | 2/2011 | Ulm et al. |
| 2011/0069745 A1 | 3/2011 | Thompson et al. |
| 2011/0072127 A1 | 3/2011 | Gerber et al. |
| 2011/0099570 A1 | 4/2011 | Sadja et al. |
| 2011/0110415 A1 | 5/2011 | Cooper et al. |
| 2011/0116387 A1 | 5/2011 | Beeco et al. |
| 2011/0150058 A1 | 6/2011 | Oh |
| 2011/0153683 A1 | 6/2011 | Hoskinson |
| 2011/0194418 A1 | 8/2011 | Wolcott et al. |
| 2011/0194597 A1 | 8/2011 | Wolcott et al. |
| 2011/0197071 A1 | 8/2011 | Wolcott et al. |
| 2011/0243214 A1 | 10/2011 | Wolcott et al. |
| 2012/0027069 A1 | 2/2012 | Clausen et al. |
| 2012/0054312 A1 | 3/2012 | Salinger |
| 2012/0084416 A1 | 4/2012 | Thibeault et al. |

(56) References Cited

U.S. PATENT DOCUMENTS

| | | | |
|---|---|---|---|
| 2012/0093240 A1 | 4/2012 | McFarland et al. | |
| 2012/0115505 A1 | 5/2012 | Miyake et al. | |
| 2012/0147751 A1 | 6/2012 | Ulm | |
| 2012/0190380 A1* | 7/2012 | Dupray et al. | 455/456.1 |
| 2013/0003565 A1 | 1/2013 | Gotwals et al. | |
| 2013/0041990 A1 | 2/2013 | Thibeault et al. | |
| 2013/0051442 A1 | 2/2013 | Cooper et al. | |
| 2013/0070772 A1* | 3/2013 | Watson et al. | 370/400 |
| 2013/0128723 A1 | 5/2013 | Thibeault et al. | |
| 2013/0148707 A1 | 6/2013 | Thibeault et al. | |
| 2013/0286852 A1 | 10/2013 | Bowler et al. | |
| 2013/0290783 A1 | 10/2013 | Bowler et al. | |
| 2013/0290791 A1 | 10/2013 | Basile et al. | |
| 2013/0291034 A1 | 10/2013 | Basile et al. | |
| 2013/0294489 A1 | 11/2013 | Thibeault et al. | |
| 2014/0029654 A1 | 1/2014 | Thompson et al. | |
| 2014/0029655 A1 | 1/2014 | Thompson et al. | |
| 2014/0133533 A1 | 5/2014 | Thibeault et al. | |
| 2014/0185428 A1 | 7/2014 | Thibeault et al. | |
| 2014/0267788 A1 | 9/2014 | Bowler et al. | |
| 2014/0269416 A1 | 9/2014 | Bowler et al. | |
| 2014/0269869 A1 | 9/2014 | Bowler et al. | |
| 2014/0270095 A1 | 9/2014 | Bowler et al. | |
| 2014/0278273 A1 | 9/2014 | Bowler et al. | |

FOREIGN PATENT DOCUMENTS

| | | | |
|---|---|---|---|
| EP | 1341335 | A2 | 9/2003 |
| JP | 55132161 | A | 10/1980 |
| JP | 04208707 | A | 7/1992 |
| JP | 06120896 | A | 4/1994 |
| JP | 06177840 | A | 6/1994 |
| JP | 09008738 | A | 1/1997 |
| JP | 09162816 | A | 6/1997 |
| JP | 10247893 | A | 9/1998 |
| JP | 11230857 | A | 8/1999 |
| JP | 2001044956 | A | 2/2001 |
| JP | 2003530761 | T | 10/2003 |
| JP | 2004172783 | A | 6/2004 |
| JP | 2004343678 | A | 12/2004 |
| WO | 0192901 | A1 | 12/2001 |
| WO | 02/33980 | A2 | 4/2002 |
| WO | 0233974 | A1 | 4/2002 |
| WO | 2004062124 | A1 | 7/2004 |
| WO | 2008/103262 | A1 | 8/2008 |
| WO | 2009146426 | A1 | 12/2009 |

OTHER PUBLICATIONS

R. Hranac, "BER and MER fundamentals", CISCO, 2007, Retrieved from the Internet: URL:http://www.gcscte.org/presentations/2008/Ron.Hranac_Presentation-BER%20+%20MER%20Fun.pdf, retrieved on Dec. 11, 2014, all pages.

Cable Television Laboratories, Inc., "A Simple Algorithm for Fault Localization Using Naming Convention and Micro-reflection Signature," Invention Disclosure 60193, 2 pages, Jun. 2008.

Cable Television Laboratories, Inc., "Data-Over-Cable Service Interface Specifications DOCSIS® 3.0—MAC and Upper Layer Protocols Interface Specification," CM-SP-MULPIv3.0-I17-111117, Nov. 2011.

Cable Television Laboratories, Inc., "DOCSIS Best Practices and Guidelines: Proactive Network Maintenance Using Pre-Equalization," CM-GL-PNMP-V01-100415, Apr. 2010.

Cable Television Laboratories, Inc., "Pre-Equalization Based Proactive Network Maintenance Process Model for CMs Transmitting on Multiple Upstream Channels," Invention Disclosure 60203, 2 pages, May 2009.

Cable Television Laboratories, Inc., "Pre-Equalization based proactive network maintenance process model", Invention Disclosure 60177, 2 pages, Jun. 2008.

Cable Television Laboratories, Inc., "DOCSIS® Best Practices and Guidelines: Proactive Network Maintenance Using Pre-equalization," CM-GL-PNMP-V02-110623, Jun. 2011.

Cable Television Laboratories, Inc., "Data-Over-Cable Service Interface Specifications: DOCSIS 2.0 Radio Frequency Interface Specification," CM-SP-RFIv2.0-I06-040804, Apr. 2004.

L.A. Campos, et al., "Pre-equalization based Pro-active Network Maintenance Methodology", Cable Television Laboratories, Inc., presentation, 32 pages, 2008.

R.L. Howald, et al., "Customized Broadband—Analysis Techniques for Blended Multiplexes," NCTA Technical Papers, 2002.

R. Howald, "Access Networks Solutions: Introduction to S-CDMA," Presentation to Society of Cable Telecommunications Engineers (SCTE) South Florida Chapter, 2009.

R. Howald, "Upstream Snapshots & Indicators (2009)," Regional Samples, Presentation to Society of Cable Telecommunications Engineers (SCTE) South Florida Chapter, Jan. 2010.

R.L. Howald et al., "Characterizing and Aligning the HFC Return Path for Successful DOCSIS 3.0 Rollouts", SCTE Cable-Tec Expo, Oct. 2009.

R. Howald, et al., "DOCSIS 3.0 Upstream: Readiness & Qualification," SCTE Cable-Tec Expo, Oct. 2009.

R. Howald, et al., "The Grown-Up Potential of a Teenage PHY", NCTA Convention and Exposition, May 2012.

R. Howald, "DOCSIS 3.0 Upstream: Technology, RF Variables & Case Studies," Access Networks Solutions, 2009, presentation to Society of Cable Telecommunications Engineers (SCTE) South Florida Chapter, 23 pages, Jan. 2010.

R. Hranac, "Linear Distortions, Part 1," Communication Technology, Jul. 2005.

X. Liu, et al., "Variable Bit Rate Video Services in DOCSIS 3.0 Networks," NCTA Technical Papers, 2008.

Motorola, Inc., "White Paper: Expanding Bandwidth Using Advanced Spectrum Management," Sep. 25, 2003.

H. Newton, Newton's Telecom Dictionary, Flatiron Publishing, 9th ed., pp. 216 and 1023 (definitions of "carrier to noise ratio" and "signal to noise ratio"), Sep. 1995.

M. Patrick, et al., "Delivering Economical IP Video over DOCSIS by Bypassing the M-CMTS with DIBA," SCTE 2007 Emerging Technologies, NCTA Technical Papers, 2007.

A. Popper, et al., "An Advanced Receiver with Interference Cancellation for Broadband Cable Networks," 2002 International Zurich Seminar on Broadband Communications—Access, Transmission, Networking, pp. 23-1-23-6, IEEE, 2002.

A. Popper, et al., "Ingress Noise Cancellation for the Upstream Channel in Broadband Cable Access Systems," 2002 IEEE International Conference on Communications, vol. 3, pp. 1808-1812. IEEE, 2002.

S.U.H. Qureshi, "Adaptive Equalization," Proceedings of the IEEE, vol. 73, No. 9, pp. 1349-1387, Sep. 1985.

S. Ramakrishnan, "Scaling the DOCSIS Network for IPTV," SCTE Conference on Emerging Technologies, NCTA Cable Show, Apr. 2009.

Y. R. Shelke, "Knowledge Based Topology Discovery and Geo-localization", Thesis, Master of Science, Ohio State University, 2010.

R. Thompson, et al., "256-QAM for Upstream HFC," NCTA 2010 Spring Technical Forum Proceedings, pp. 142-152, May 2010.

R. Thompson, et al., "256-QAM for Upstream HFC Part Two", SCTE Cable-Tec Expo 2011, Technical Paper, Nov. 2011.

R. Thompson, et al., "Multiple Access Made Easy," SCTE Cable-Tec Expo 2011, Technical Paper, Nov. 2011.

R. Thompson, et al., "Optimizing Upstream Throughput Using Equalization Coefficient Analysis", National Cable & Telecommunications Association (NCTA) Technical Papers, Apr. 2009.

R. Thompson, et al., "Practical Considerations for Migrating the Network Toward All-Digital", Society of Cable Telecommunications Engineers (SCTE) Cable-Tec Expo, Oct. 2009.

R. Thompson, et al., "64-QAM, 6.4MHz Upstream Deployment Challenges," SCTE Canadian Summit, Toronto, Canada, Technical Paper, Mar. 2011.

B. Volpe, et al., "Cable-Tec Expo 2011: Advanced Troubleshooting in a DOCSIS© 3.0 Plant," Nov. 2011.

(56) References Cited

OTHER PUBLICATIONS

L. Wolcott, "Modem Signal Usage and Fault Isolation," U.S. Appl. No. 61/301,835, filed Feb. 5, 2010.

F. Zhao, et al., "Techniques for minimizing error propagation in decision feedback detectors for recording channels," IEEE Transactions on Magnetics, vol. 37, No. 1, pp. 592-602, Jan. 2001.

Y. Morishita, et al., "An LMS adaptive equalizer using threshold in impulse noise environments", IEEE, ICT 2003 10th International Conference on Telecommunications, vol. 1, pp. 578-582, Feb. 2003.

* cited by examiner

| MESSAGE | SEVERITY | LOCATION |
|---|---|---|
| FEC CORRECTED THRESHOLD EXCEEDED | WARNING | US CH 10 |
| FEC UNCORRECTED THRESHOLD EXCEEDED | MINOR | US CH 20 |
| FLAP THRESHOLD EXCEEDED | WARNING | US CH 10 |
| CHANNEL UTILIZATION EXCEEDED | WARNING | US CH 25 |

| TOPOLOGY | CRITICAL | MAJOR | MINOR |
|---|---|---|---|
| ▷ CMTS-1 | 0 | 0 | 4 |
| ▽ CMTS-2 | 2 | 2 | 1 |
|    FN-A | 2 | 1 | 1 |
|    FN-B | 0 | 0 | 0 |
| ▷ CMTS-3 | 0 | 0 | 0 |
| ▷ CMTS-4 | 0 | 0 | 0 |
| ▷ CMTS-5 | 0 | 0 | 0 |

ALARM TOPOLOGY TREE EXPANDS OUT TO DISPLAY CONTEXT SENSITIVE ALARM COUNTS

*FIG. 6*

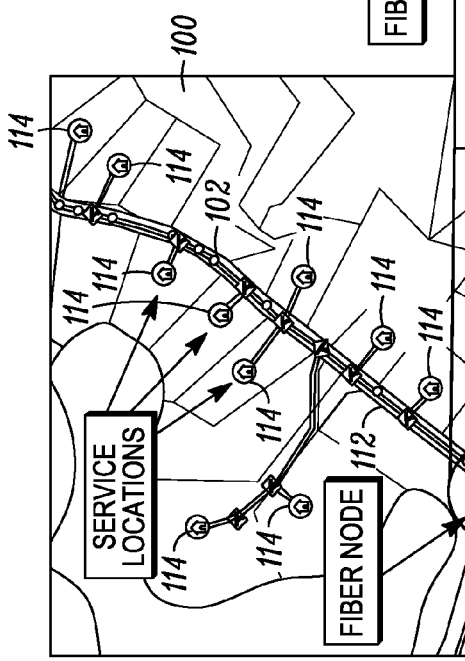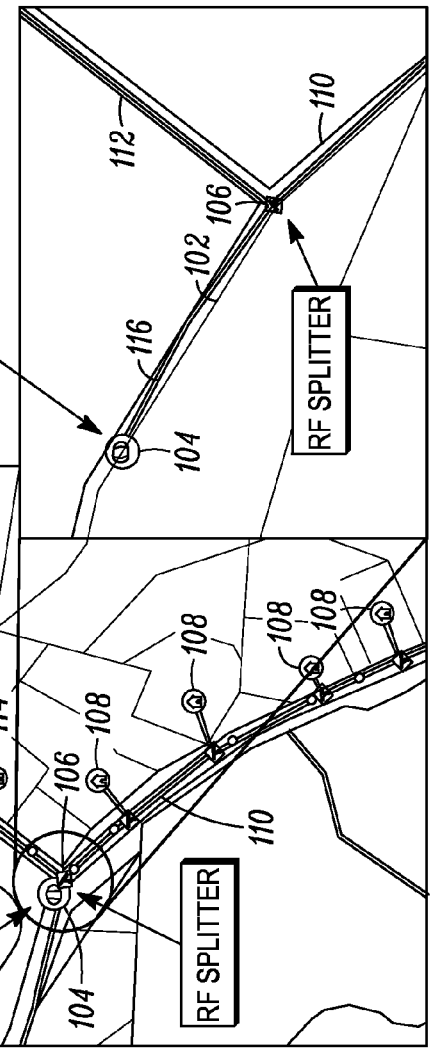

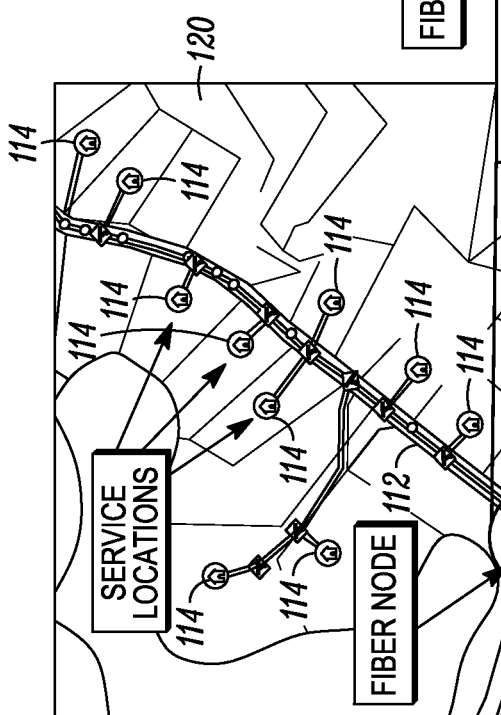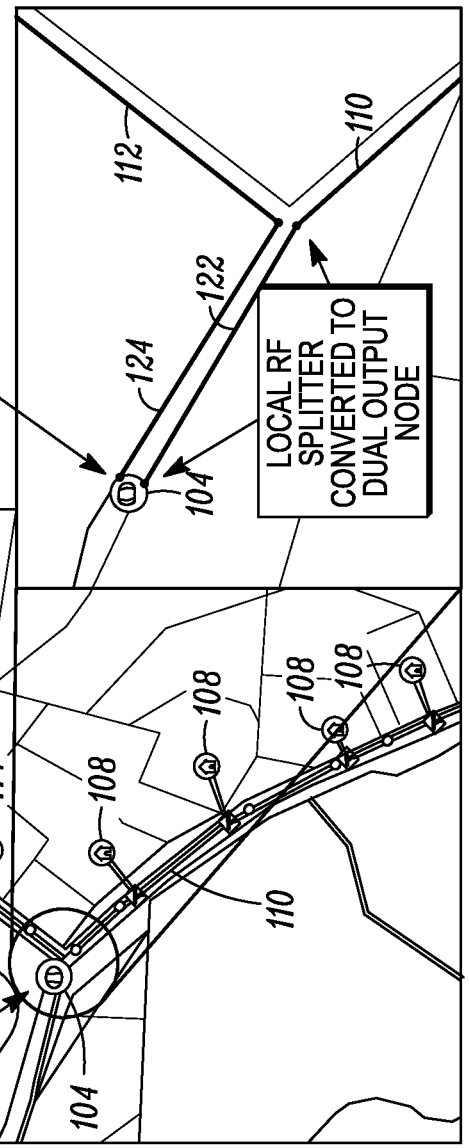

METHOD FOR ESTIMATING CABLE PLANT TOPOLOGY

BACKGROUND

Program providers such as multiple system operators, television networks and stations, cable TV operators, satellite TV operators, studios, wireless service providers, and Internet broadcasters/service providers, among others, require broadband communication systems to deliver programming and like content to consumers/subscribers over networks via digital or analog signals. Such networks and physical plants tend to be extensive and complex and therefore are difficult to manage and monitor for faults, impairments, maintenance issues and the like.

Monitoring network maintenance activities particularly presents problems to operators of extensive cable networks. For purposes of example, a cable network may include a headend which is connected to several nodes that may provide access to IP or ISPN networks. The cable network may also include a variety of cables such as coaxial cables, optical fiber cables, or a Hybrid Fiber/Coaxial (HFC) cable system which interconnect terminal network elements of subscribers to the headend in a tree and branch structure. The terminal network elements (media terminal adaptors (MTAs), cable modem, set top box, etc.) reside on the nodes which may be combined and serviced by common components at the headend.

Cable modems may support data connection to the Internet and other computer networks via the cable network. Thus, cable networks provide bi-directional communication systems in which data can be sent downstream from the headend to a subscriber and upstream from a subscriber to the headend. The headend typically interfaces with cable modems via a cable modem termination system (CMTS) which has several receivers. Each receiver of the CMTS may connect to numerous nodes which, in turn, may connect to numerous network elements, such as modems, media terminal adaptors (MTAs), set top boxes, terminal devices, customer premises equipment (CPE) or like devices of subscribers. A single receiver of the CMTS, for instance, may connect to several hundred or more network elements.

The conventional process for tracking which terminal devices are attached to which optical node and like information is a manual process. For instance, when a new customer's services are first enabled, a network operator may identify the specific node or location of the user and enter this information manually into a customer management database. This information can be valuable for resolving physical layer communications issues, performing periodic plant maintenance, and planning future service expansions. However, when the data is inaccurate or incomplete, it can lead to misdiagnosis of issues, excessive costs associated with maintenance, and prolonged new deployments. In addition, as communication traffic increases or new services are deployed, the need to understand loading of parts of the network becomes important, particularly if existing subscribers must be reallocated to different nodes or parts of the network.

Based on conventional practice, locating and identifying network and physical plant issues essentially relies upon the receipt of customer calls and manual technician analysis in response thereto.

BRIEF DESCRIPTION OF THE DRAWINGS

Various features of the embodiments described in the following detailed description can be more fully appreciated when considered with reference to the accompanying figures, wherein the same numbers refer to the same elements.

FIG. 6 is a view similar to FIG. 5 with the alarm tree further expanded in accordance with an embodiment.

FIG. 15 is a view of an estimated path (before adjustment) of a section of a network extending downstream from a fiber-optic node in accordance with an embodiment.

FIG. 16 is a magnified view of the fiber-optic node and adjacent RF splitter of FIG. 15 in accordance with an embodiment.

FIG. 17 is a view of an estimated path (after adjustment) of a section of a network extending downstream from a fiber-optic node in accordance with an embodiment.

FIG. 18 is a magnified view of the fiber-optic node and separate paths extending from different outlet ports of the node of FIG. 15 in accordance with an embodiment.

DETAILED DESCRIPTION

Figure 1:
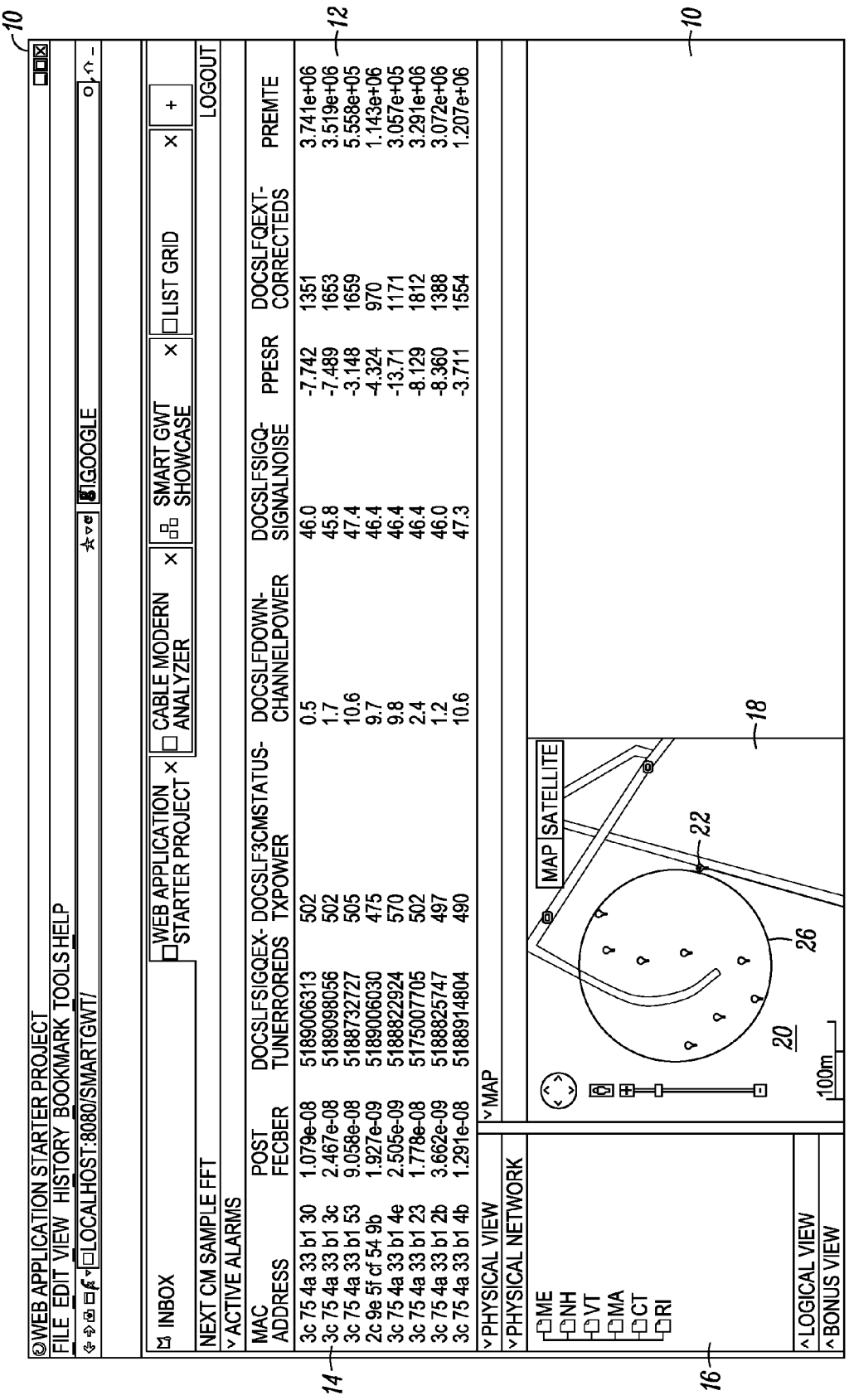
FIG. 1 is a snapshot screen view of a so-called dashboard of a graphical user interface according to an embodiment.

For simplicity and illustrative purposes, the principles of embodiments are described by referring mainly to examples thereof. In the following description, numerous specific details are set forth in order to provide a thorough understanding of the embodiments. It will be apparent however, to one of ordinary skill in the art, that the embodiments may be practiced without limitation to these specific details. In some instances, well known methods and structures have not been described in detail so as not to unnecessarily obscure the embodiments.

Embodiments disclosed herein are directed to automated management and monitoring systems, tools, and methods that enable issues occurring in a network, such as a cable network, to be proactively and automatically detected and located. The embodiments leverage a combination of key data and network topology such as information concerning the geographical location of an issue, the nature of the issue, and/or the severity of an issue to permit a network operator to quickly detect, isolate, locate and address problems. In addition, collection and analysis of historical, long term and periodic health information of a network provided by the embodiments can aid in determining trends that may indicate slow and steady degradation of a network element or component. Such degradation has conventionally remained undetected when relying only on manual spot checks by field technicians and only becomes detectable upon component failure.

According to embodiments, the above referenced tasks are accomplished automatically by a management and monitoring tool that is able to scale across extremely large networks thereby enabling network operators to become more proactive with network maintenance activities and to achieve higher levels of network availability and reliability. Operational costs can be reduced by decreasing the need for troubleshooting at a time after the occurrence of the problem or issue. In addition, the periodic collection and analysis of network conditions provides a view into critical network indicators and aids in resolving issues prior to customer impact.

Network monitoring can be performed such that information concerning geographic location of monitored network elements, such as cable modems or the like, and associated network component topology, such as HFC components and the like, are automatically populated into a network management database or the like for purposes of providing a visual display, such as a geographically accurate street map or satellite image of a region of a service area, that clearly indicates a fault or other issue and the geographical location thereof. Thus, the path that the network takes geographically is displayed on the map along with the physical location of network elements and components within the network. Such a map provides a useful network management tool to network operators and field technicians for resolving issues in an efficient and prompt manner.

As one contemplated example, the map can be provided as part of a graphical interface which displays faults of varying severity levels ranging from critical to completely non-service affecting. Accordingly, in at least some embodiments, the severity of a fault on the network can be determined and displayed with the estimated geographic location of the fault on the map.

In addition, the network monitoring and management system or tool can be provided and fully integrated into software that is loaded and resides on a server or remote server connected to or communicating with the network. Of course, the software may reside on other devices and equipment such as equipment located at the headend of the network, cloud devices, and portable or mobile devices. Utilization of the software eliminates the need for manual analysis of data and permits large amounts of data to be automatically analyzed electronically by microprocessors or the like on a large scale.

The network management tool or software may estimate and make assumptions regarding probable tap and passive locations, and couple this information with known optical node location data, and with walking directions data from a geographical data (geodata) services provider. Walking directions data may be in accordance with an appropriate format, language, or standard; examples include, but are not limited to, data in Keyhole Markup Language (KML), e.g., Open Geospatial Consortium (OGC) KML, or the OpenGIS KML Encoding Standard. From this cumulative information, the network management tool or software can estimate and automatically populate a map or the like of a given service area with monitored cable modem locations and associated network component topology.

The geographic location of a fault and surrounding network path can be estimated, isolated, and displayed despite minimum information and manually entered data concerning the actual network path or network element location being available. The graphical interface can identify and display specific network elements as problematic. As an example, a network or HFC component such as cables, taps, passives, or the like that is identified as a suspect component potentially contributing to linear distortion, excessive loss impairments, or the like may be identified and displayed as a location of a fault. Whether a fault impacts a single subscriber or a group of subscribers may also be estimated and shown in the display.

Still further, the network management tool may be used to identify clusters or groups of network elements or cable modems that may share network or HFC infrastructure, such as common components including optics, nodes, amps, cables, taps, passives, and the like. In this regard, Management Information Base (MIB) information for service groups readily available via data pulls from a CMTS or like equipment at the headend of the network can be used in conjunction with the above referenced geographical location information. Network element groups or clusters can be readily displayed via the graphical interface and without the need for the software to reference other sources, perform testing, or wait for common impairment signature alarms to be raised.

Still further, the severity of a fault may be estimated with respect to upstream impairments through association of physical layer metrics including pre and post forward error correction (FEC) along with the number of impacted network elements or subscribers. Higher priority alarms can be assigned to groups of network elements or subscribers that exceed threshold values. In contrast, lower priority alarms can be assigned to faults such as detected for single network elements or subscribers.

According to an embodiment, the graphical interface referenced above may be presented in the form of a so-called "dashboard" to a user such as personnel of a network operations center. Critical alarms may be shown across the entire network in a geographical display of the network or parts thereof. In addition, access may be provided to statistics via use of the dashboard to allow the user to monitor the overall health of their network.

By way of example, various snap-shot views of a graphical user interface are provided in FIGS. 1-14. It should be understood that these displays are disclosed for purposes of example only and may be altered as desired.

Figure 2:
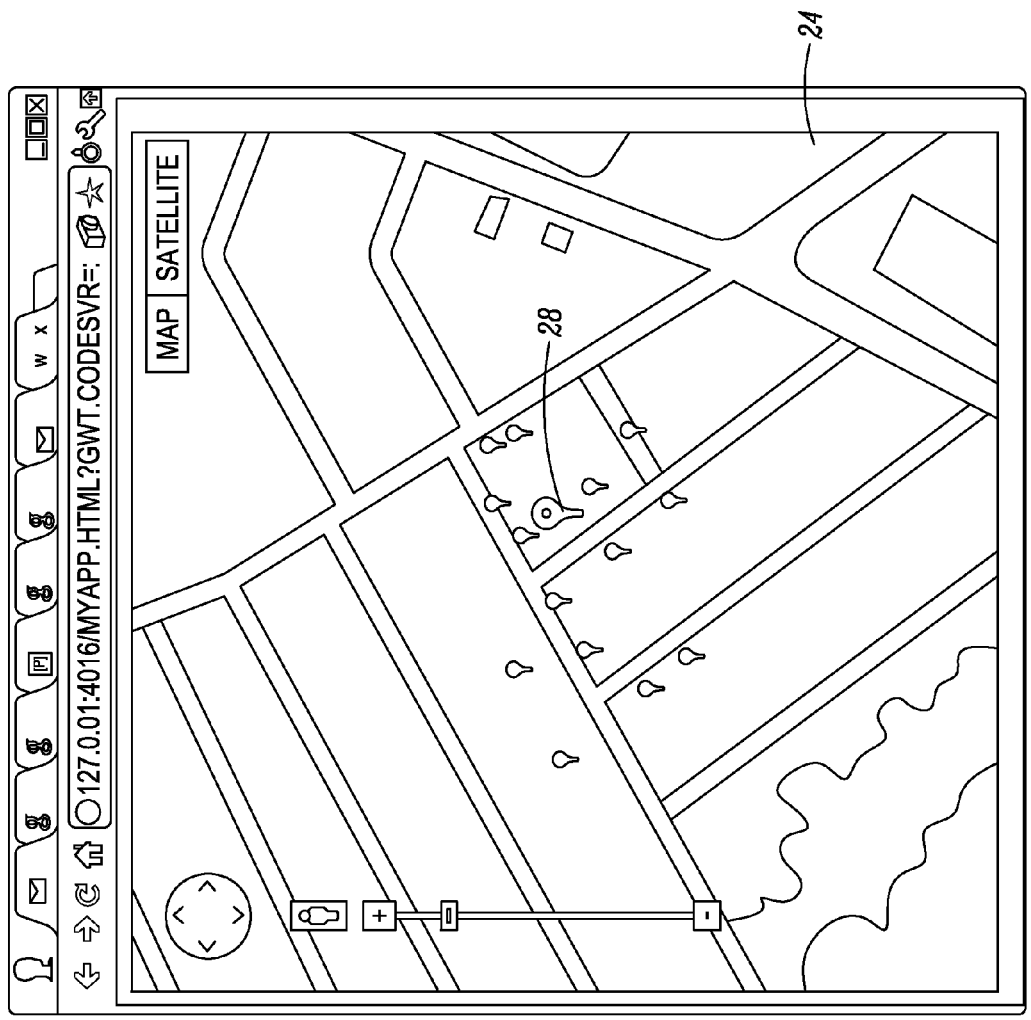
FIG. 2 is a view of a panel of the dashboard showing a cluster of objects displayed on top of a satellite image of a geographic area into which a network extends according to an embodiment.

A first example of a dashboard 10 which may be displayed to a user via a monitor or like electronic display screen is shown in FIG. 1. In this example, a first panel 12 of the dashboard 10 provides information of "Active Alarms" including a list of alarms or potential faults 14, a second panel 16 provides a so-called "Physical View" of the network, and a third panel 18 provides a geographically-accurate street map 20 showing the geographical location of the alarms listed in panel 12 along with the nearest node 22 or other network component. The map 20 may include roads and streets and names thereof. In addition, as best illustrated in FIG. 2, alarms can be overlaid on images 24, for instance satellite images, of the geographical service area in which the alarms are located.

When an issue, fault or alarm is identified, it can be associated and displayed with other issues, faults and alarms based on geographical proximity. For instance, see the alarms 14 within circle 26 in FIG. 1. This group or cluster of alarms provides a visual indicator of the network elements affected and can indicated a center point of a potential problem causing the cluster of alarms. For instance, see the center point 28 in FIG. 2. A user which selects the center point may be provided with a listing of problem network elements or modems. In addition, the cluster of alarms may have a single corresponding "alarm" object to thereby reduce the number of alarms displayed to the user.

After an issue is first identified by the network monitoring and management system, tool or software, the operator or user may be provided with several options to further investigate the apparent problem or problems. For instance, network issues may be isolated by "serving group" or "geographic proximity" (i.e., clustering) and may be prioritized by severity based on the number of customers/subscribers affected and the extent to which faults are service-affecting. The network faults can be linked by the management software to a map interface which enables the fault to be connected to a physical location in the network.

FIGS. 3-11 provide further examples of views of a dashboard which may be displayed to a network operator. Any type or number of available charts, maps, or alert views can be viewed and organized in the dashboard. By way of example, the dashboard 30 shown in FIG. 3 may be configured as a starting point when a user first logs onto the network monitoring and management software or system. Here, a "zoomed-out" view of the network is initially provided to permit an overall view of the network, which may span a large geographic area. Data is collected and analyzed by the network monitoring and management tool to identify a type of fault or faults and the estimated geographic location of the fault(s) solely based on analysis of the data.

Figure 3:
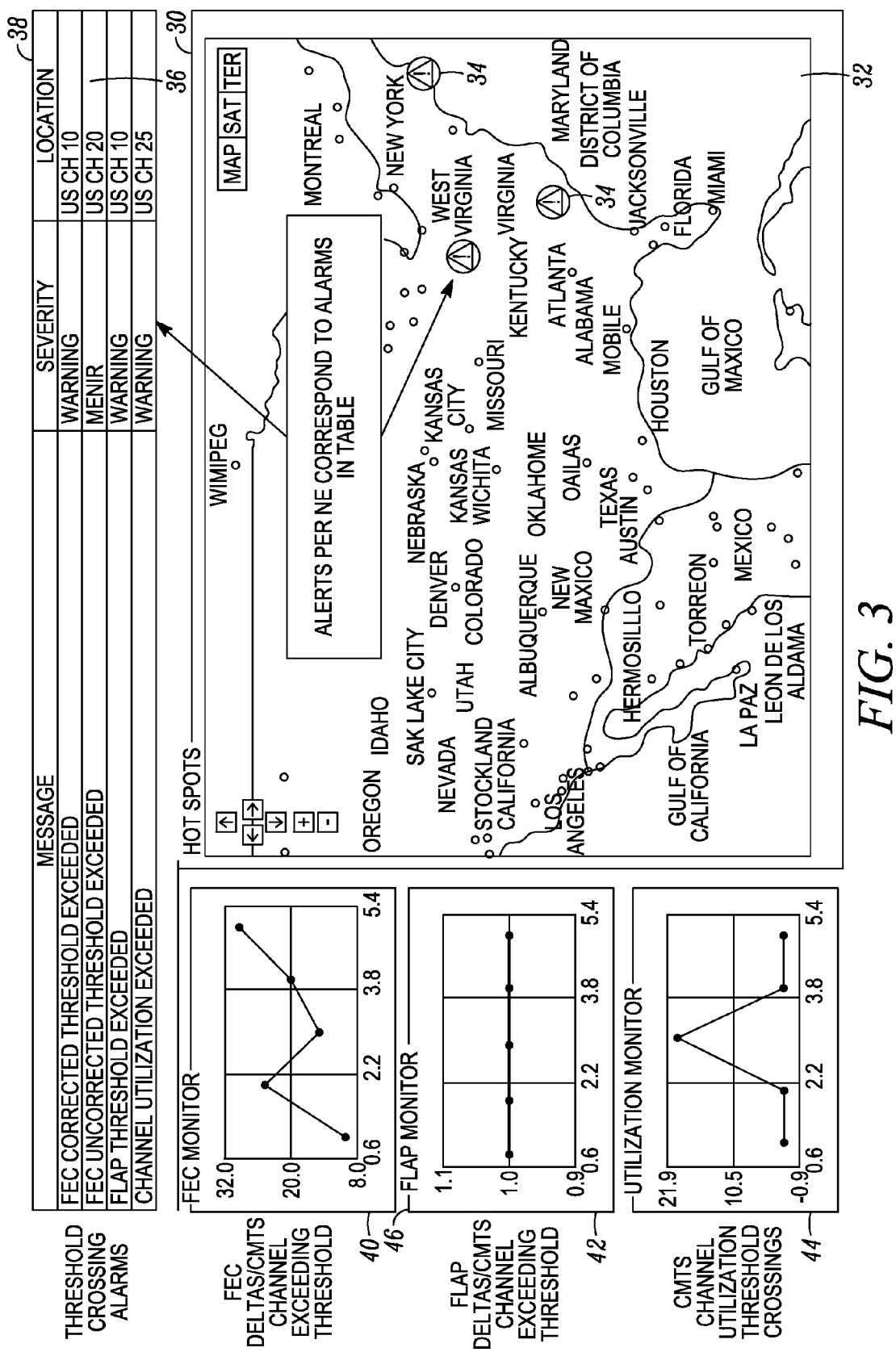
FIG. 3 is a view of an interactive user interface display which may provide a starting point of the dashboard once a user logs into the system according to an embodiment.
Figure 4:
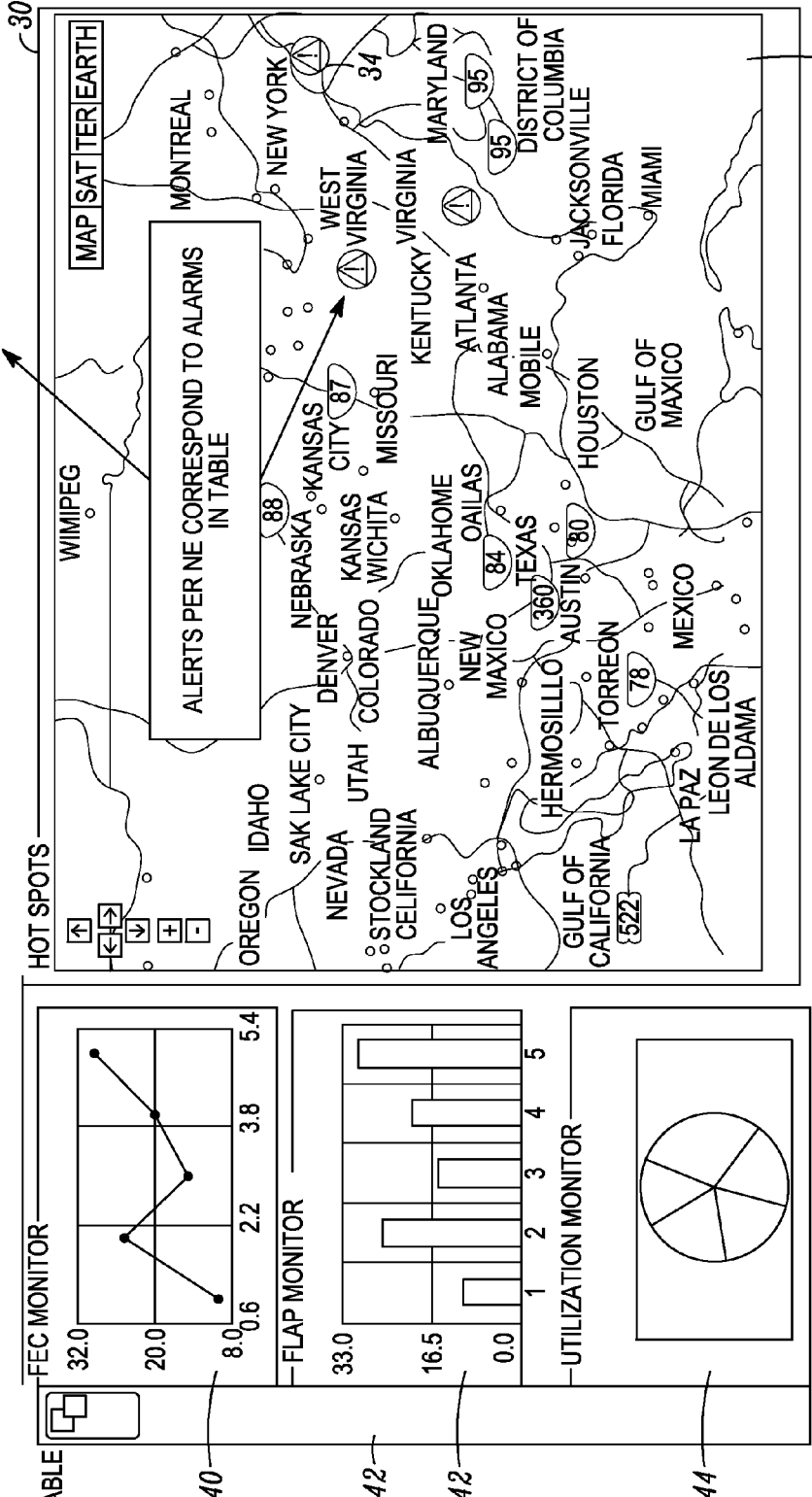
FIG. 4 is a view similar to FIG. 3 with the map further zoomed-in to a particular region of the network service area according to an embodiment.

FIG. 3 provides an entire network view 32 based on a geographic format and provides an indication of so-called "hot-spots" 34 of alarms. A listing 36 of alarms can be provided in a panel 38 which can also indicate the severity and location of the hot-spots 34. Charts such as a FEC deltas/ CMTS channel exceeding threshold chart 40, a Flap deltas/ CMTS channel exceeding threshold chart 42, and a CMTS channel utilization threshold crossing chart 44 can be displayed in a panel 46 and correspond to the alarms shown in the listing 36. Of course, these charts provide just a few examples of possible charts. A further example of such a dashboard is shown in FIG. 4 which provides a display of a section of the map 48 in greater detail.

Figure 5:
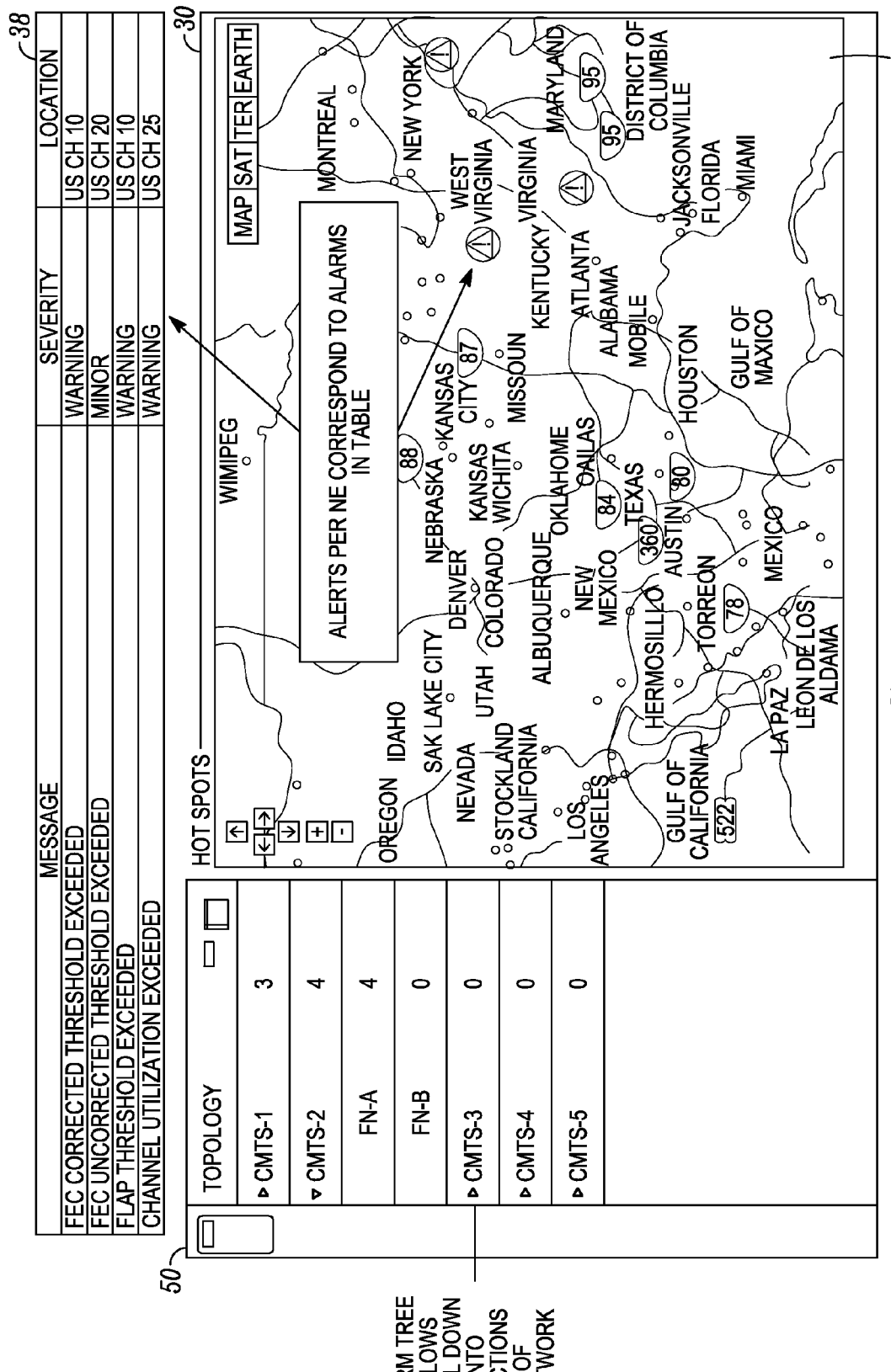
FIG. 5 is a view of an interactive user interface display which shows an alarm tree for use in investigating information of alarms shown on the display according to an embodiment.

In FIG. 5, a dashboard is shown in which panel 50 provides information on network topology. Here, the topology is provided in a form of a so-called alarm tree which enables a user to gain further information with respect to more narrowly defined sections of the network. For example, the topology could list CMTSs (such as CMTS-1, CMTS-2, CMTS-3, CMTS-4, and CMTS-5). Further, the fiber nodes (i.e., FN-A and FN-B) can be shown for any of the CMTSs and a number of network elements associated with an alarm can be listed. As shown in FIG. 6, the panel 50 can also be expanded to show the number of network elements associated with alarms per severity of alarm (i.e., critical, major, and minor).

Figure 7:
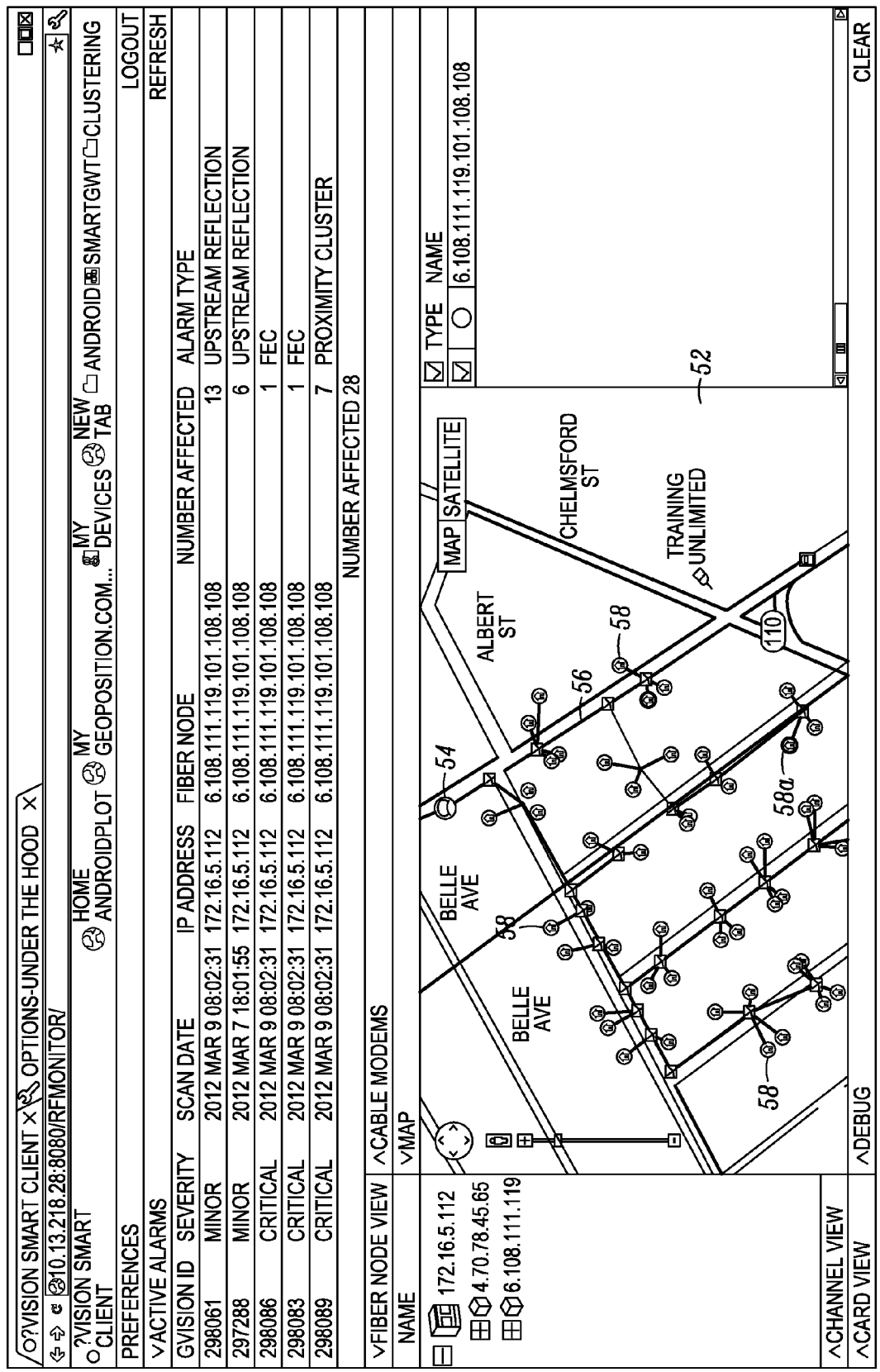
FIG. 7 is a view of a graphical user interface with a local geographic map showing a node location, terminal network elements, network path, and alarms in accordance with an embodiment.
Figure 8:
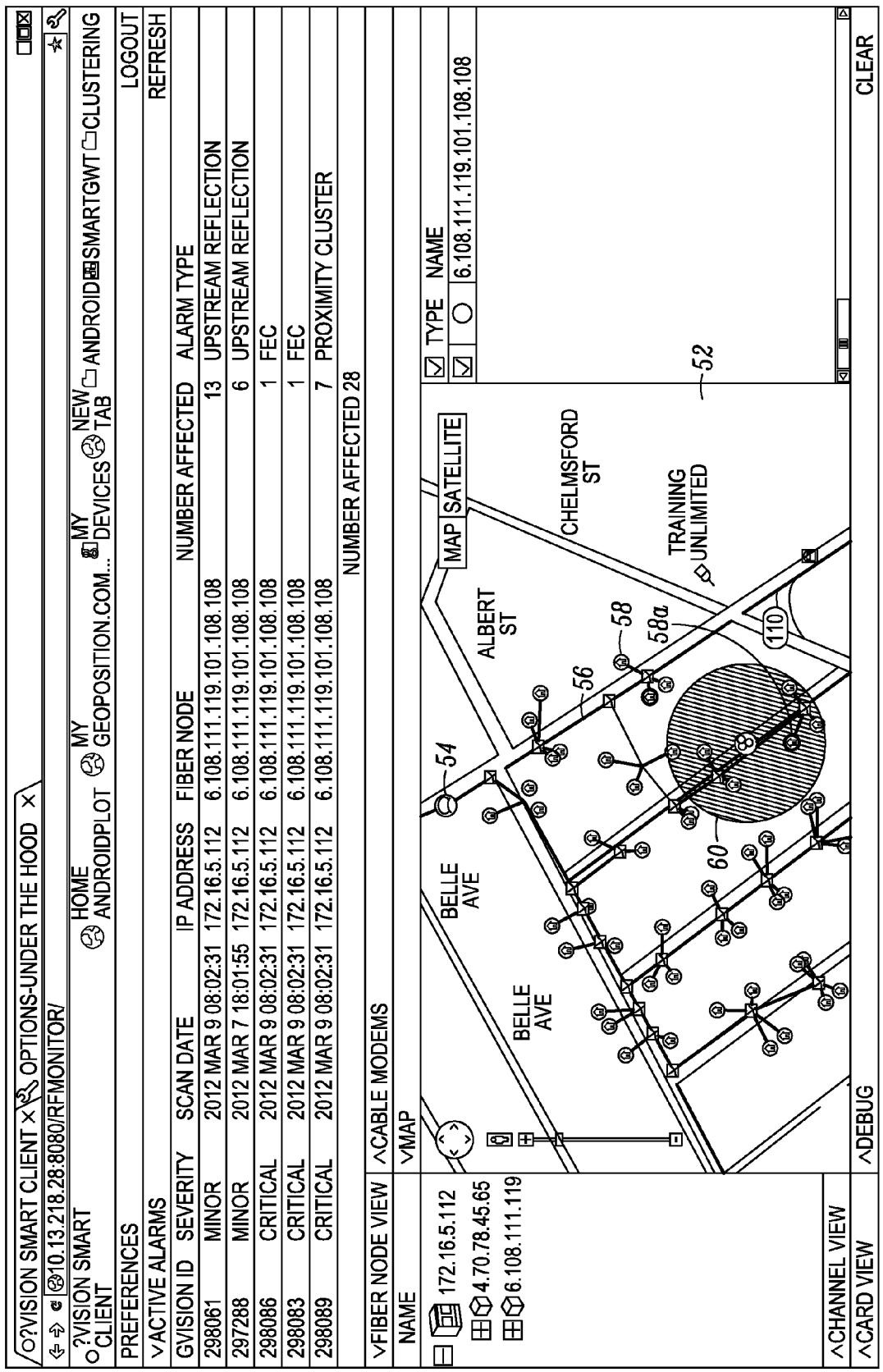
FIG. 8 is a view of a graphical user interface similar to FIG. 7 with a cluster of terminal network elements highlighted based on geo-proximity in accordance with an embodiment.

A more local view of a street map 52 is shown in FIG. 7. Here a single fiber node 54 of the network is shown as is the network path 56 extending from the node 54 to terminal network elements 58, such as cable modems, serviced via the node 54. The shade (or color, etc.) of the terminal networks elements 58 can be used to visually indicate an alarm on the map 52. For instance, terminal network element 58a is shown in a dark shade (or a particularly color, such as red) which may indicate an alarm of critical severity whereas terminal network elements displayed in lighter shades (other colors, such as yellow) may indicate an alarm of a minor severity. This same map 52 can be further investigated as shown in FIG. 8 in which a geo-proximity cluster 60 is shown highlighted. The path 56 of the cable plant may be estimated and shown such as in FIGS. 7 and 8. If desired, the user of the management tool is able to adjust the path 56 or enter in any known network topology information into the management software or tool should the estimated path and view be inaccurate.

Figure 9:
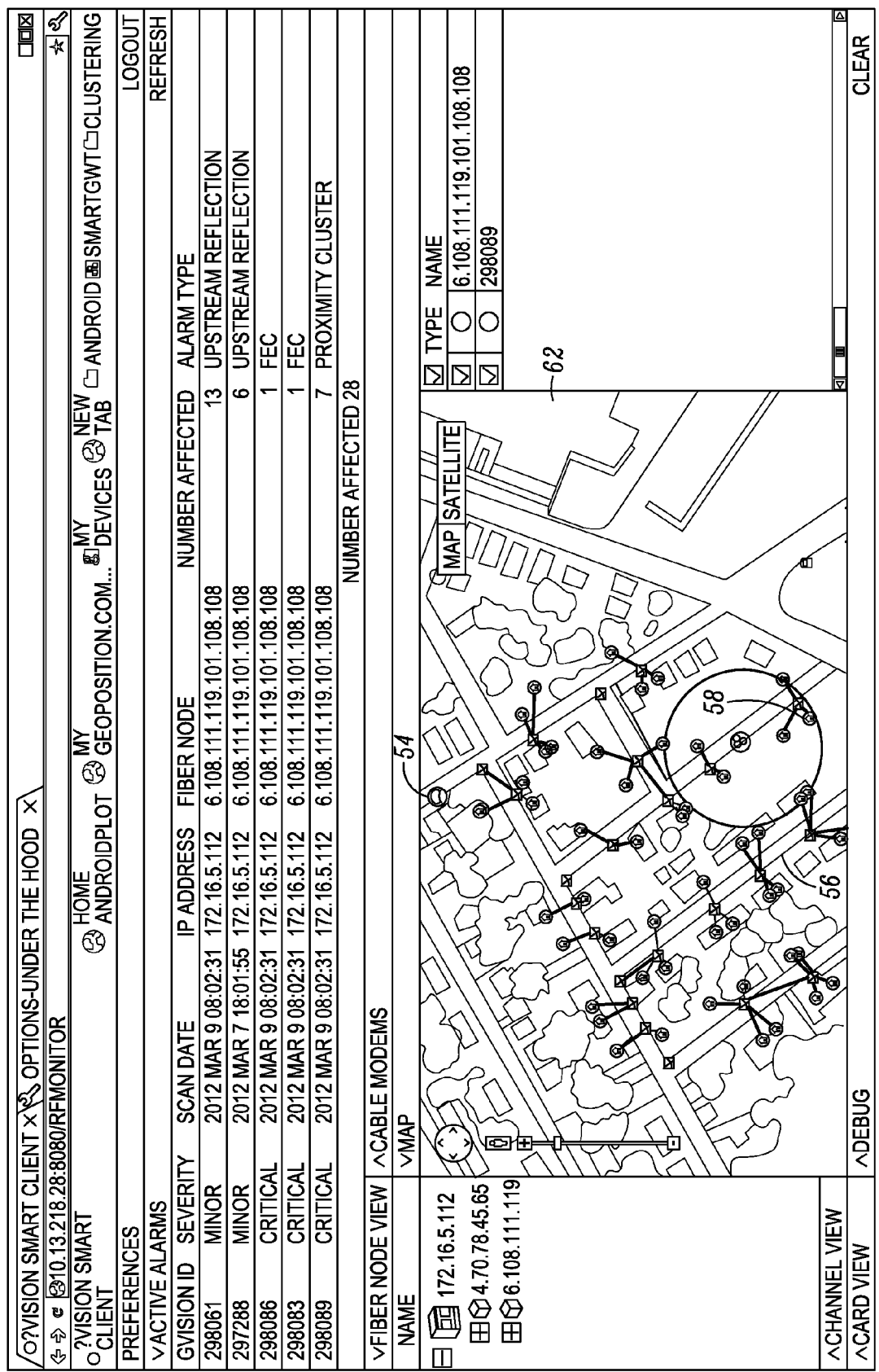
FIG. 9 is a view of a graphical user interface similar to FIG. 8 that is displayed on a satellite image of the geographic area according to an embodiment.
Figure 10:
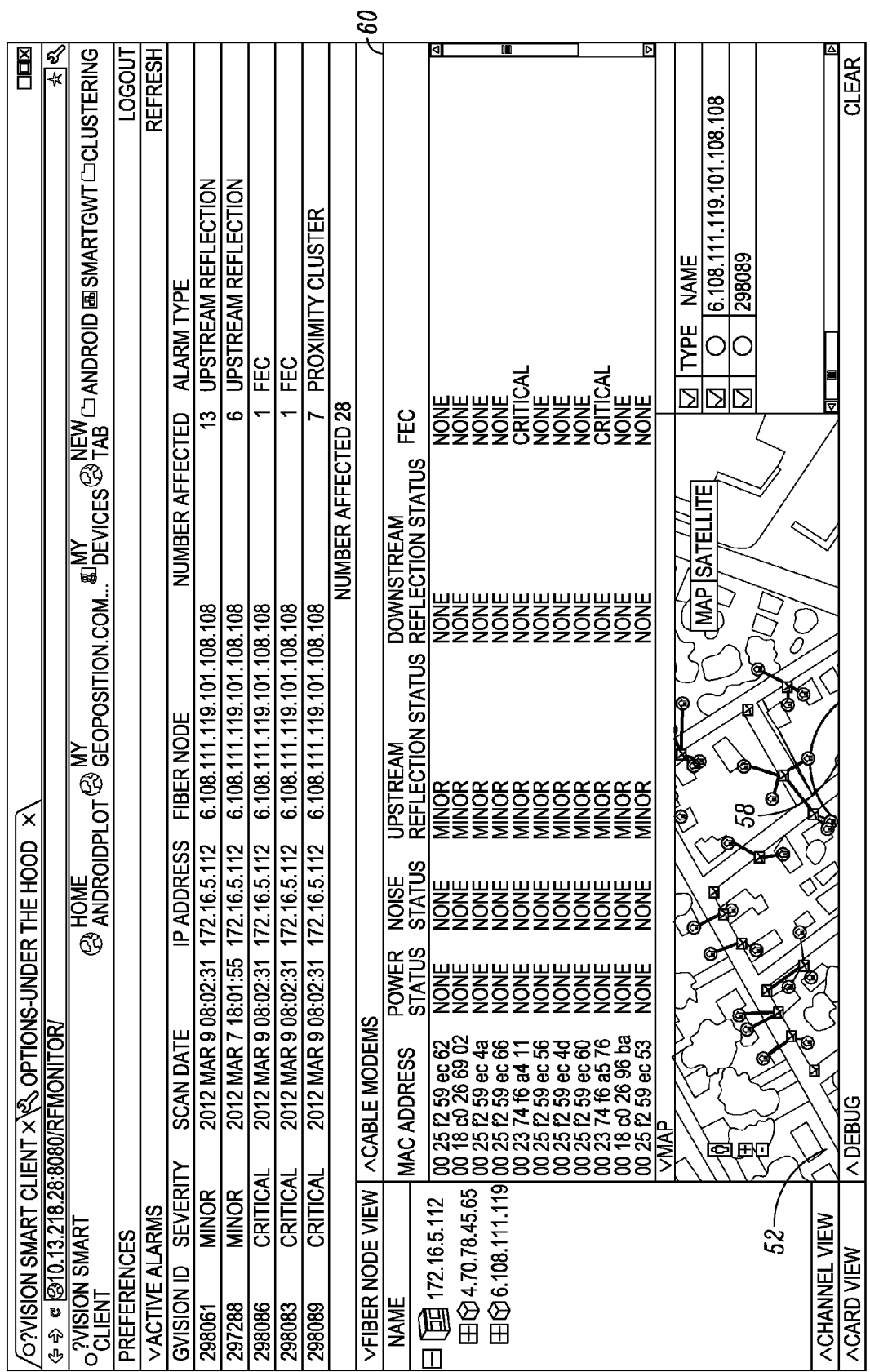
FIG. 10 is a view of a graphical user interface similar to FIG. 9 and including a listing of alarms for the cable modems displayed on the map according to an embodiment.
Figure 11:
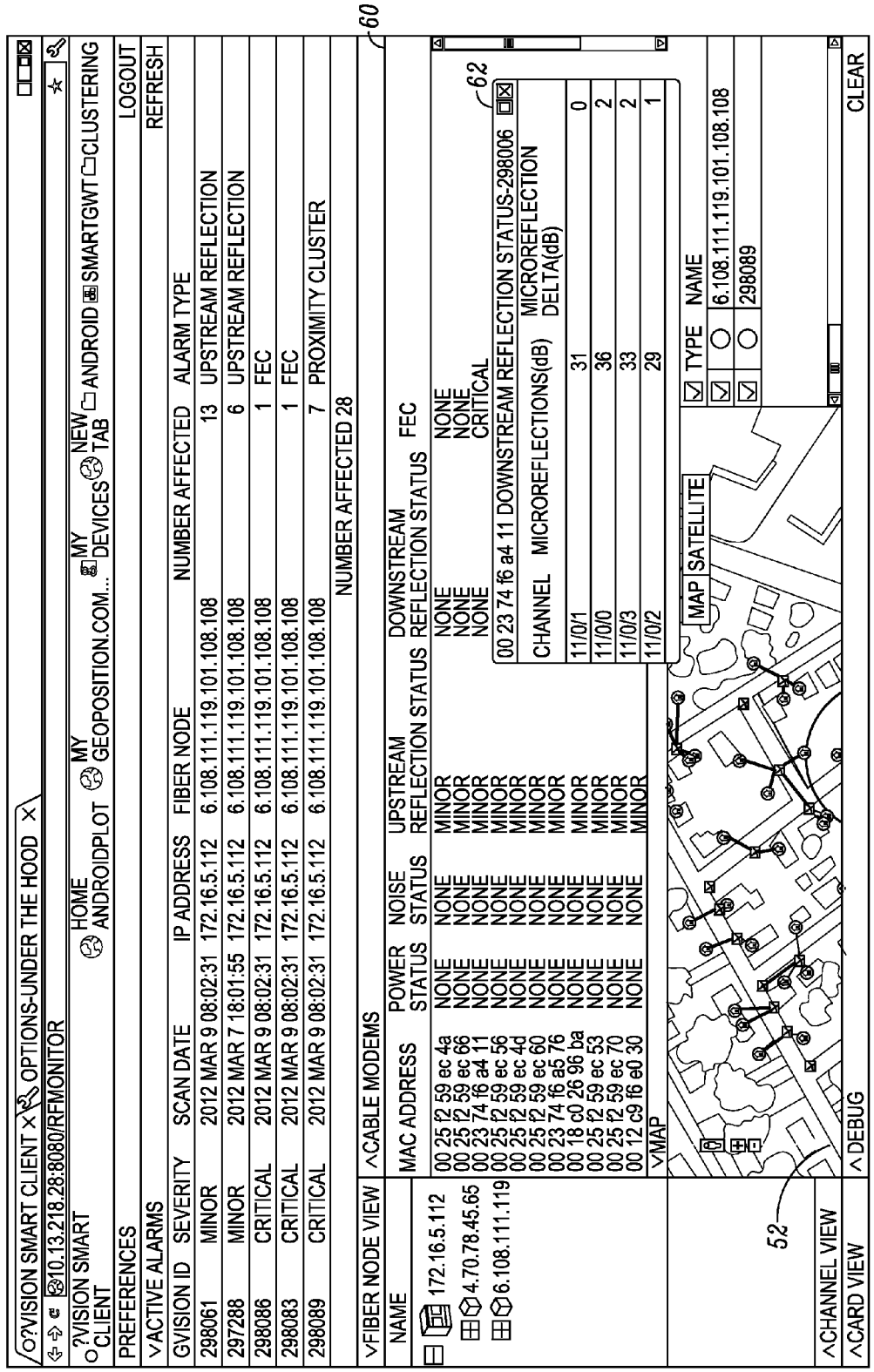
FIG. 11 is a view of a graphical user interface similar to FIG. 10 and including a listing of a particular performance parameter (in this instance, downstream microreflections in dBs for absolute and delta values) for the cable modems displayed on the map and channels used thereby according to an embodiment.

Another view similar to FIG. 7 is shown in the map 62 of FIG. 9. Here the street map 52 has been modified to show actual satellite imagery of the surrounding geographic area. The node 54, path 56, and terminal network elements 58 are overlaid on the satellite imagery as are the alarms and other network topology. For purposes of further investigating a potential network fault, the "cable modems" illustrated in FIG. 9 can be shown in a drop down window 64 such as shown in FIG. 10. Here the MAC address, power status, noise status, upstream reflection status, downstream reflection status, FEC status for each cable modem or terminal network element 58. Some of these cable modems and listed statuses have no alarms whereas others have alarms of "minor" severity while others have alarms of "critical" severity. FIG. 11 shows the ability of the tool to further investigate network issues. Here, measurements corresponding to downstream microreflections in dBs are listed (as absolute and delta values) and shown in a window 66 so that a user may view these or any other values that are or are not the subject of an alarm.

Accordingly, after a network operator center user views the above referenced dashboards and investigates alarms therewith, for instance as shown above, and has identified a particular issue that needs to be resolved, the network monitoring and management tool, software or system can be used to assist the user in sending an appropriate field technician to the correct geographical location. The user can also use the management tool or software to assess the urgency with respect to the need to resolve the issue.

The network monitoring and management system, tool or software can also be used by a service technician in the field. For example, the network monitoring and management software may be run on a remote server that is accessible by the technician such as via a secure wireless web interface. For instance, a mobile device, such as a portable, lap-top, notebook, or tablet computer, a smart phone, or the like may be used to obtain various views, information and maps as discussed above. Accordingly, provided information can be used for rapid, real-time debugging of field issues and provide geographic information, provide real-time monitoring of upstream and downstream performance metrics and error states, and permit a technician to see the interdependency of multiple issues. The above can reduce the need for the technician to access the inside of residences, reduce the number of calls the technician needs to make to the head-end, and enable the technician to update network topology information while in the field. For purposes of this disclosure, "real-time" includes a level of responsiveness that is sufficiently fast to provide meaningful data that reflects current or recent network conditions as well as a level of responsiveness that tolerates a degree of lateness or built-in delay.

Figure 12:
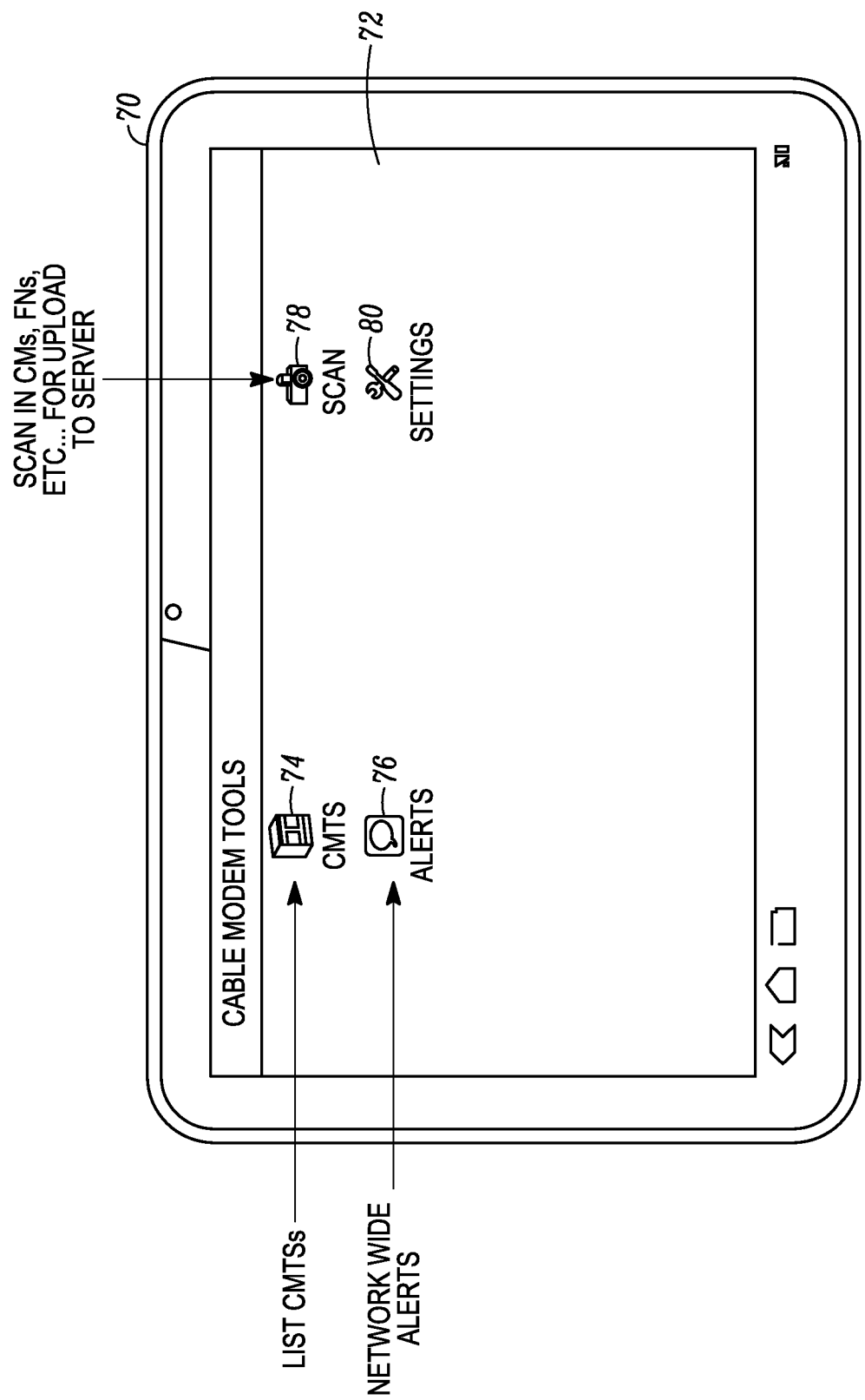
FIG. 12 is a view of a wireless communication tablet having a display screen that may be used by a field technician in accordance with an embodiment.
Figure 13:
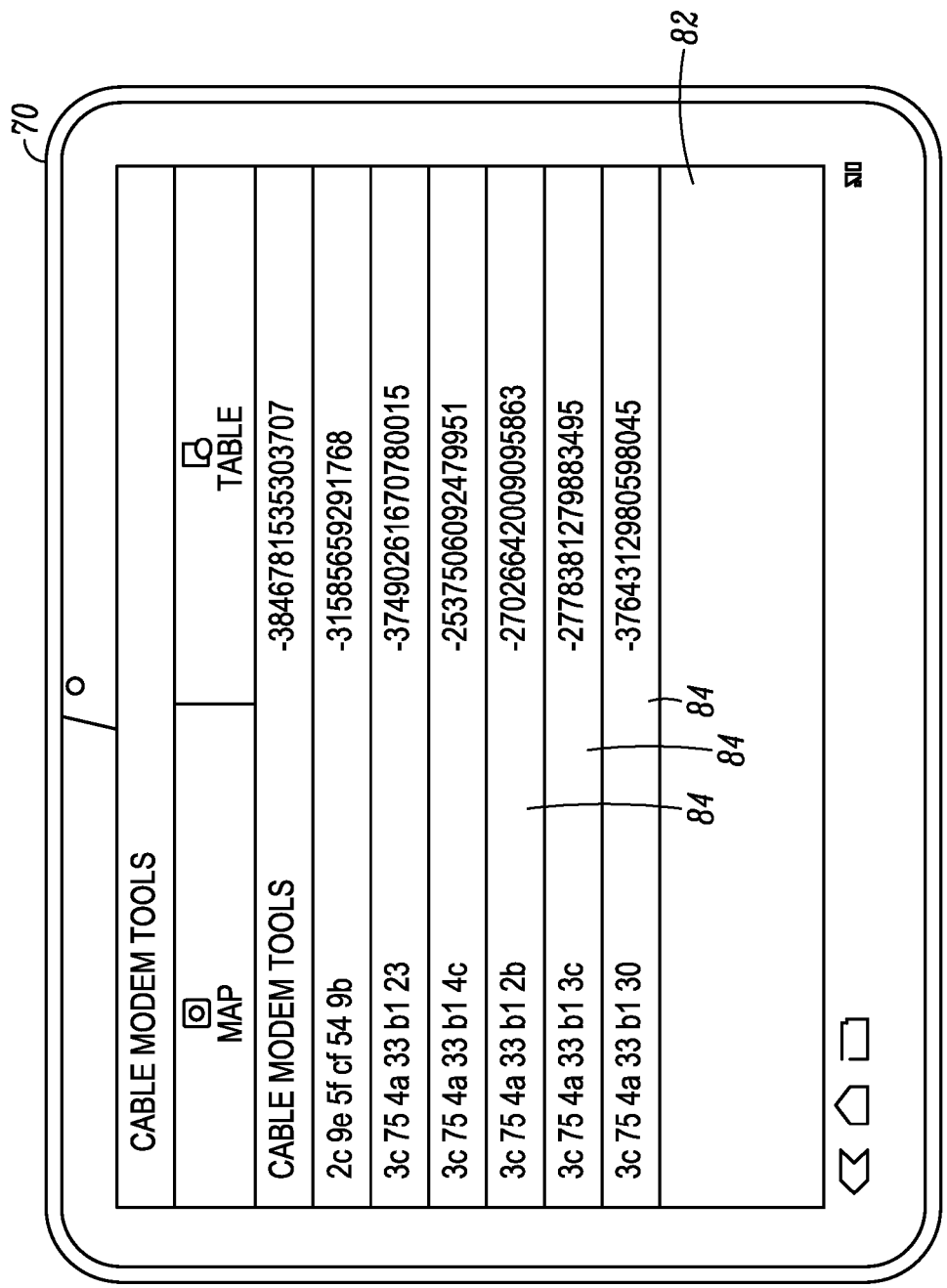
FIG. 13 is a snapshot view of a display screen of the tablet providing a list of faulted modems in accordance with an embodiment.
Figure 14:
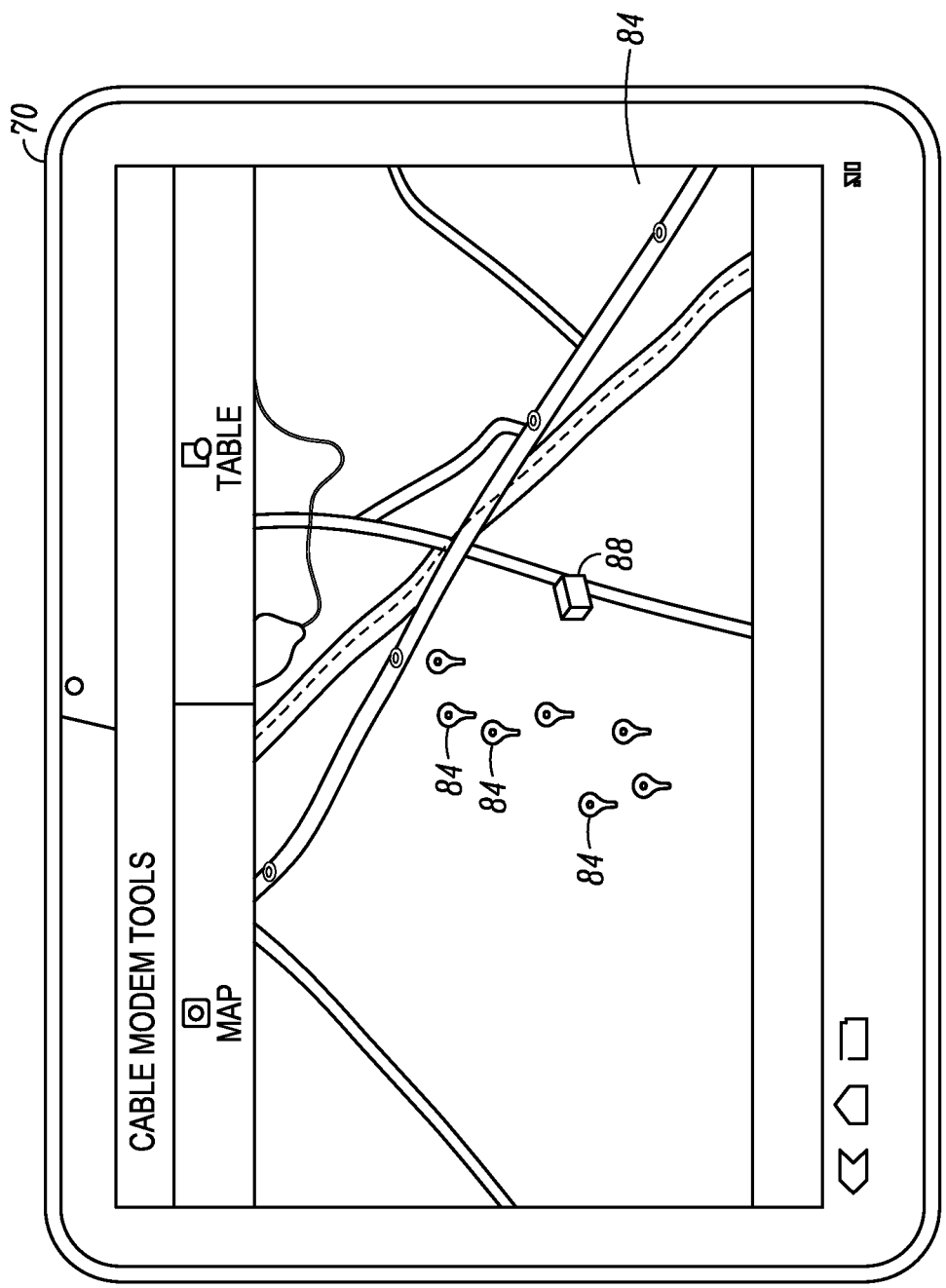
FIG. 14 is a snapshot view of a display screen of the tablet providing the geographic locations of the faulted modems on a street map in accordance with an embodiment.

A tablet 70 is shown in FIGS. 12-14 that may be used by a field technician to connect to the network monitoring and management software. In FIG. 12, the technician is provided with a display 72 that includes an icon 74 for a list of the CMTSs, an icon 76 for network wide alerts, an icon 78 for scanning or uploading information into the system, and a settings icon 80. FIG. 13 shows a display 82 providing a tabular view of network devices 84 having faults, and FIG. 14 shows a display 86 showing the same network devices 84 in a geographical map-style platform with the closest fiber node 88 or like network component. All of the above provides helpful and useful information to the field technician.

Various methods can be used by the network monitoring and management system, software, and tool described above that enables fault determination, fault location, mapping of the network geographically, displaying of faults with and without network topology information, displaying a cluster of network elements impacted by the same fault, and the severity of the fault. For example, a combination of monitored parameters and network topology information can be used to identify the likely physical locations of cable network defects. This approach is able to be implemented in software utilizing numerical analysis. In addition, a combination of sub-algorithms can be used to locate a common network failure point even when several different and potentially, seemingly unrelated, issues are observed.

Accurate network topology information is critical when trying to determine fault location within a plant. However, as discussed above, network operators seeking to implement a large scale network monitoring and management system are typically challenged by the need to enter all network topology information into a database for use by the network monitoring and management software. This manual data entry process can be extremely time consuming and expensive; however, if accomplished, such a database and information can provide extremely valuable information to the network operator.

According to an embodiment of the tool, an algorithm is utilized for accurately auto-generating cable plant topologies while taking into account variable output port counts of fiber nodes and RF amplifiers. Typically, nodes and amplifiers within a cable plant will have about 1 to 4 separate output ports. The tool uses data that is gathered from cable modems throughout the cable network and from the CMTS to locate issues within the cable plant and uses the auto-generated topology to analyze the data and identify issues. If the data and topology being analyzed are accurate, issues and the location of the issues within the cable plant can be identified and corrected possibly before becoming service affecting.

According to an embodiment of the tool, a network monitoring and management system includes an automated process of approximating the path of a network. The automated process of approximating the path of a network eliminates the manual task of entering and defining the network path and permits the task of populating a database with such information to be accomplished quickly with little or no manual effort. For this purpose, walking directions data can be used to estimate the path of a cable network, for instance, the path cabling of the network takes between a node (i.e., such as a fiber optic node) and a terminal network element (for instance, a cable modem). With this approach, slight errors in path estimation may be tolerated, and the location estimation of network issues can be accurate.

Walking directions data may be in accordance with an appropriate format, language, or standard; examples include, but are not limited to, data in Keyhole Markup Language (KML), e.g., Open Geospatial Consortium (OGC) KML, or the OpenGIS KML Encoding Standard. In an illustrative example, KML is an Extensible Markup Language (XML) notation for expressing geographic annotation and visualization, e.g., within Internet-based, two-dimensional maps and three-dimensional browsers. The KML file specifies a set of features (place marks, images, polygons, 3D models, textual descriptions, etc.) for display in any type of geospatial software implementing KML encoding. Each place or feature on the map is assigned a longitude and latitude. KML files may be distributed in KMZ files, which are zipped files with a ".kmz" extension. The contents of a KMZ file typically include a single root KML document (notionally "doc.kml") and optionally any overlays, images, icons, and 3D models referenced in the KML including network-linked KML files. By convention the root KML document is at root level and referenced files are in subdirectories (e.g. images for overlay images).

Accordingly, via the use of walking directions data, the physical locations of network faults and physical geographic location information of fiber nodes in the network can be displayed on a street map or satellite image. Fiber node information is typically stored by the network operator and would be readily available to the network monitoring and management software by importing such data via data pulls.

According to an embodiment, mapping a network path can include estimating a geographic path of cables of a network between a geographic location of a network component and a geographic location of a terminal network element electronically using walking directions data of a surrounding geographic area (i.e., streets, etc.). A geographically-accurate map is populated with the geographic location of the network component, the geographic location of the terminal network element, and the estimated geographic path. The auto-generated geographic map data may be displayed via geospatial software.

During estimating, the walking directions data can be used, for instance, to electronically determine a path corresponding to a shortest walking distance following streets encoded in the data between the geographic location of the network component and the geographic location of the terminal network element. This path which follows the layout of the streets is used as the geographic path of the cables of the network. A visual form of the geographic street map can be displayed by a user with geospatial software in which the network component, the terminal network element, and the geographic path (e.g., following the path of streets) are graphically shown on the visual form of the geographic map. In addition, a geographic location of a suspected network fault can be added onto the geographic map for being graphically shown on the visual form of the geographic map.

Information can be electronically received concerning the network component and the geographic location of the network component. For example, the network component may be a fiber optic node on a cable network and the information may be imported from a database via a cable modem termination system (CMTS). Information can also be electronically received concerning the terminal network element and the geographic location of the terminal network element. For example, a service address of the terminal network element can be imported from a database, and the geographic location of the terminal network element on the geographic map can be marked as the geographic location of the service address.

A location of a tap of the terminal network element can be defined as a location on a street in front of the service address, and the location of a drop cable can be estimated as a connection between the geographic location of the service address and the estimated location of the tap. A path corresponding to a shortest walking direction following the layout of streets obtained from geo-encoded data of a street map from the network component at one end to the terminal network element at the opposite end can be determined and used as the geographic path of the network between the network component and the tap. In this estimation process, the path of the cables of the network is deemed to follow street layout obtained from geo-encoded data. Thus, the path may follow along a first street and then turn right or left onto a second street at an intersection or the like.

The above path estimating procedure can be repeated automatically by the software for each terminal network element connected to the network component, and the numerous paths estimated can be overlaid to produce an overall estimated network path for a predetermined service area of the network. Thus, where overlaid paths extend along the same street, these cable are consolidated as one cable, and where overlaid paths separate at intersections or the like, a splitter may be deemed to be located at the intersection such that paths are permitted to extend in different directions from the intersection. This is discussed in greater detail below. The end result is typically a path having a tree and branch architectural form extending from the node to the terminal network elements following the street layout of the service area.

A determination as to which cable modem is connected to which fiber node can be made, for instance, by either of the following alternatives. If information is readily available with respect to which network elements are in which DOCSIS serving groups, then a particular fiber node will be connected to the cable modems that are known to be within the same serving group assigned to the node. Alternatively, if this information is not readily accessible by the network monitoring and management software, then each cable modem is determined (estimated) to be connected to the fiber node to which it is physically closest (i.e., Manhattan distance).

With the above information displayed on a geographical map, points where paths intersect, but have not previously been marked as taps, can be identified as splitters with an exception discussed below. The only actual difference between a tap and a splitter is the power ratio of the outputs. In addition, points of network power level discontinuities observed relative to network architecture can be identified as locations of amplifiers. However, when an intersection appears to occur a close distance to a fiber node or amplifier, consideration is given as to whether the intersection is a splitter or whether the intersection in reality is separate paths extending from multiple outlet ports of the node or amplifier. This is discussed below with the following examples.

An example of estimating a topology 100 of a path 102 of a cable network extending adjacent a fiber node 104 is shown in FIG. 15. In this example, the node is considered to only have a single output port and the algorithm for estimating the path does not take into account that nodes and amplifiers typically include multiple separate output ports, for example, two to four outlet ports. Thus, in FIG. 15, the algorithm represents an otherwise multiple output configuration of a node as having a single output port with a 1×N RF splitter 106 located downstream on the path 102 closely spaced to the node 104. This section of the path 102 is shown magnified in FIG. 16. Here, the RF splitter 106 represents a downstream interconnection of two distinct paths for terminal network elements or cable modems fed by the same outlet port of the fiber node 104 regardless of how close this intersection is to the actual fiber node 104.

A disadvantage of the estimated path 102 shown in FIGS. 15 and 16 is that the cable modems 108 on a branch 110 of the path 102 are considered to extend on the same path 102 as the branch 112 with cable modems 114. For instance, as best shown in FIG. 16, the path 102 has a common section 116 extending between the node 104 and the splitter 106, and an intersection of the branches 110 and 112 is formed at the splitter 106. When analyzing data with respect to faults and like issues with this estimated topology, the cable modems 108 and the cable modems 114 are considered to reside on the same path 102 and issues are analyzed as though the cable modems 108 and 114 are on the same path 102. If this topology is inaccurate, analysis of such data may cause errors and result in the generation of inaccurate identification of issues and estimated fault locations.

In contrast to the above example, a second example of estimating a topology 120 of the network path for the same node 104, branches 110 and 112, and cable modems 108 and 114 according to an embodiment is shown in FIGS. 17 and 18. In this example, the algorithm takes into account the fact that nodes and amplifiers may have more than one output port and considers how close an intersection is with respect to the location of the fiber node or amplifier. Accordingly, the existence of a splitter is not automatically assumed as in the previous example. Rather, if an intersection is within a predetermined distance (for instance, 200 feet or less) of the fiber node 104 (or an amplifier), separate paths 122 and 124 are estimated as extending from different output ports of the same fiber node 104. Thus, the cable modems 108 and 114 and the branches 110 and 112 on these separate paths, 122 and 124, are not analyzed as residing on the same path. Rather, cable modems 108 and branch 110 form parts of path 122, and cable modems 114 and branch 112 form parts of a separate path 124 that extends from a different outlet port of the same node 104. Accordingly, when data concerning faults, issues, defects and the like are analyzed, the two paths 122 and 124 and the cable modems connecting thereto are analyzed separately for most types of faults to thereby improve the accuracy of the fault determination and location.

In the above example, the algorithm interprets an intersection of two paths located within 200 feet of the node (or an amplifier) and independently routes them to separate outputs on the node (or amplifier). It should be understood that the exact distance threshold for interpreting an intersection as a splitter or as being the result of separate outlet ports of a node or amplifier can be set as any distance desired. The use of 200 feet for such a distance is provided only for purposes of example. This distance could be increased or decreased, as desired. As discussed above, the consideration of an intersection located closely to a node or amplifier as being the result of using different outlet ports versus being a splitter can significantly improve the accuracy of the auto-generated cable plant topology in the immediate vicinity of a fiber node or RF amplifier which in turn improves the accuracy of the overall fault and fault location estimations. Accurate plant information is critical to the analysis.

With the topology estimated as described above, the network path and location of network elements and components can now be estimated and displayed by the network monitoring and management software. This software also provides the user with the ability to adjust the path and edit (add, delete or move) elements and components within the graphic display of the network and save them to the database as such information is verified by a field technician or the like. Thus, as more and more information is added into the database and saved, the accuracy of the results and future results can be further improved.

Figure 19:
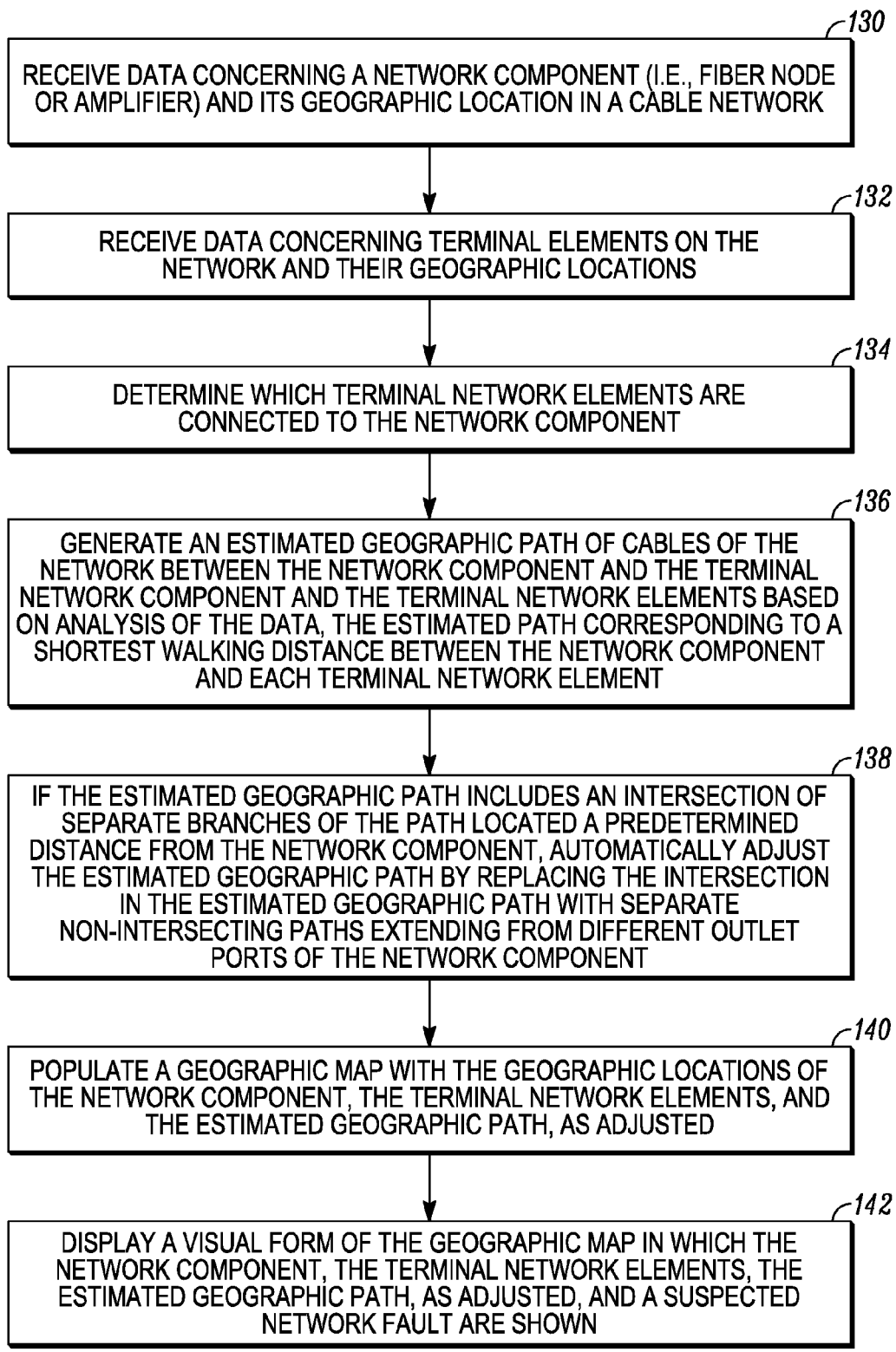
FIG. 19 is a flowchart of a process of estimating network topology when taking into account the existence of multiple outlet ports of network components in accordance with an embodiment.

FIG. 19 provides a flowchart of the above algorithm of estimating a topology of a network, such as a cable network having fiber optic nodes, amplifiers, and like network components with multiple outlet ports. In step 130, information is received electronically via data pulls or the like concerning a network component and a geographic location of the network component. As an example, this information may be imported from a cable modem termination system (CMTS) or like headend device of the network.

In step 132, information is received electronically of terminal network elements and the geographic locations of the terminal network elements. The geographic locations may be the service addresses of the terminal network elements pulled from a subscriber database. For purposes of determining which terminal network elements are connected to the network component, information can be received electronically in step 134 concerning terminal network elements within the same DOCSIS serving group and the network component responsible for the DOCSIS serving group.

With the above data, an estimated geographic path of cables of the network between the geographic location of the network component and each geographic location of terminal network elements served by the network component can be automatically generated. See step 136. Here, the data used during this step may be walking directions data (e.g., KML data), and the walking directions data may be used to electronically determine a path corresponding to a shortest walking distance between the geographic location of the network component and the geographic locations of each terminal network element. The path corresponding to the shortest walking distance can be used as the estimated geographic path of the cables of the network. A path can be estimated for each terminal network element connected to the network component, and then the paths can be combined or overlaid to generate the estimated geographic path for a predetermined service area of the network.

After the estimated geographic path is generated in step 136 and if the estimated geographic path includes an intersection of separate branches of the path located a predetermined distance from the network component in a downstream direction extending from the network component to the terminal network element, the estimated geographic path is automatically adjusted by replacing the intersection in the estimated geographic path with separate non-intersecting paths extending from different outlet ports of the network component to the separate branches. See step 138. As an example, the predetermined distance may be 200 feet or less.

After step 138, a geographic map can be populated in step 140 with the geographic location of the network component, the geographic locations of the terminal network elements, and the estimated geographic path as adjusted as discussed above. In addition, in step 142, a visual form of the geographic map can be displayed with geospatial software, in which the network component, the terminal network elements, the estimated geographic path, as adjusted, and a suspected network fault are graphically shown on the visual form of the geographic map.

Various modifications can be implemented with the above described method. For example, corrections of the path estimation based on the curvature of the earth, summation of highly segmented paths into a single path, and removal of redundant data for scalability can be implemented to refine the estimated path or provide a desired view to the user.

A signal processing electronic device, such as a server, remote server, CMTS or the like can run a software application to provide the above process steps and analysis. In addition, a non-transitory computer readable storage medium having computer program instructions stored thereon that, when executed by a processor, cause the processor to perform the above discussed operations can also be provided.

The above referenced signal processing electronic devices for carrying out the above methods can physically be provided on a circuit board or within another electronic device and can include various processors, microprocessors, controllers, chips, disk drives, and the like. It will be apparent to one of ordinary skill in the art the modules, processors, controllers, units, and the like may be implemented as electronic components, software, hardware or a combination of hardware and software.

While the principles of the invention have been described above in connection with specific networks, devices, apparatus, systems, and methods, it is to be clearly understood that this description is made only by way of example and not as limitation on the scope of the invention as defined in the appended claims.

We claim:

1. A method of estimating a topology of a network, comprising the steps of:
   automatically generating an estimated geographic path of cables of a network between a geographic location of a network component and a geographic location of a terminal network element from data providing the geographic location of the network component and the geographic location of the terminal network element;
   if the estimated geographic path includes an intersection of separate branches of the path located a predetermined distance from the network component in a downstream direction extending from the network component to the terminal network element, adjusting the estimated geographic path by replacing the intersection in the estimated geographic path with separate non-intersecting paths extending from different outlet ports of the network component to the separate branches; and
   populating a geographic map with the geographic location of the network component, the geographic location of the terminal network element, and the estimated geographic path as adjusted during said adjusting step.

2. The method according to claim 1, wherein the network is a cable network and wherein the network component includes multiple separate outlet ports and is selected from a group consisting of a fiber optic node and an amplifier.

3. The method according to claim 1, wherein the predetermined distance is 200 feet or less.

4. The method according to claim 1, wherein the data used during said step of automatically generating an estimated geographic path includes geo-encoded data providing information of a geographic layout of streets within a service area.

5. The method according to claim 1, wherein, during said step of automatically generating an estimated geographic path, the geo-encoded data is used to electronically determine a path extending along the geographic layout of streets and corresponding to a shortest walking distance along the streets between the geographic location of the network component and the geographic location of the terminal network element, and wherein the path corresponding to the shortest walking distance along the streets is used as the estimated geographic path of the cables of the network.

6. The method according to claim 1, wherein the geographic map generated during said populating step is displayable with geospatial software using geo-encoded data.

7. The method according to claim 6, further comprising the step of displaying a visual form of the geographic map in which the network component, the terminal network element, and the estimated geographic path as adjusted during said adjusting step are graphically shown in the visual form of a street map.

8. The method according to claim 7, further comprising the step of adding a geographic location of a suspected network fault on the street map.

9. The method according to claim 7, further comprising the step of receiving information electronically concerning the terminal network element and the geographic location of the terminal network element, wherein said receiving step includes importing a service address of the terminal network element from a database and marking the geographic location of the terminal network element on the street map as a geographic location of the service address.

10. The method according to claim 9, wherein said step of generating the estimated geographic path includes estimating a location of a tap of the terminal network element as a location on a street in front of the service address and estimating a location of a drop cable as a connection between the geographic location of the service address and the estimated location of the tap.

11. The method according to claim 10, wherein said step of generating the estimated geographic path includes determining a path that follows along streets in the street map and that corresponds to a shortest walking direction from the network component to the terminal network element along the streets included in the street map and defining this path as the geographic path of the network between the network component and the tap.

12. The method according to claim 7, further comprising the step of populating a point on the street map as an amplifier if network power level discontinuities are monitored at a location on the estimated geographic path.

13. The method according to claim 1, further comprising the step of receiving information electronically concerning the network component and the geographic location of the network component, wherein said receiving step includes importing the information from a database via a cable modem termination system (CMTS).

14. The method according to claim 1, further comprising the steps of repeating said generating step for each terminal network element connected to the network component, and overlaying the estimated geographic paths generated to produce an overall estimated network path having a tree and branch architectural form for a predetermined service area of the network, wherein said adjusting step is performed after said repeating and overlaying steps.

15. The method according to claim 14, further comprising the step of determining which terminal network elements are connected to the network component, wherein said determining step includes electronically receiving information concerning DOCSIS serving groups and connecting terminal network elements that are determined to be within a same Data Over Cable Service Interface Specification (DOCSIS serving group to the network component which is determined responsible for the DOCSIS serving group.

16. A signal processing electronic device for estimating a topology of a network, comprising at least one processing unit configured to:
   automatically generate an estimated geographic path of cables of a network between a geographic location of a network component and a geographic location of a terminal network element from data providing the geographic location of the network component and the geographic location of the terminal network element;
   if the estimated geographic path includes an intersection of separate branches of the path located a predetermined distance from the network component in a downstream direction extending from the network component to the terminal network element, adjust the estimated geographic path by replacing the intersection in the estimated geographic path with separate non-intersecting paths extending from different outlet ports of the network component to the separate branches;
   populate a geographic map with the geographic location of the network component, the geographic location of the terminal network element, and the estimated geographic path as adjusted during the adjusting.

17. At least one non-transitory computer readable storage medium having computer program instructions stored thereon that, when executed by at least one processor, cause the at least one processor to:
   automatically generate an estimated geographic path of cables of a network between a geographic location of a network component and a geographic location of a terminal network element from data providing the geographic location of the network component and the geographic location of the terminal network element; and
   if the estimated geographic path includes an intersection of separate branches of the path located a predetermined distance from the network component in a downstream direction extending from the network component to the terminal network element, adjust the estimated geographic path by replacing the intersection in the estimated geographic path with separate non-intersecting paths extending from different outlet ports of the network component to the separate branches; and
   populate a geographic map with the geographic location of the network component, the geographic location of the terminal network element, and the estimated geographic path as adjusted during the adjusting.

* * * * *